(12) United States Patent
Geron et al.

(10) Patent No.: US 10,887,079 B1
(45) Date of Patent: Jan. 5, 2021

(54) DIGITAL PREDISTORTION (DPD) TIMING ALIGNMENT IN A REMOTE UNIT(S) FOR A WIRELESS COMMUNICATIONS SYSTEM (WCS)

(71) Applicant: Corning Research & Development Corporation, Corning, NY (US)

(72) Inventors: Nir Geron, Beer Yakov (IL); Roi Yosy Ziv, Ramat Gan (IL)

(73) Assignee: Corning Research & Development Corporation, Corning, NY (US)

( * ) Notice: Subject to any disclaimer, the term of this patent is extended or adjusted under 35 U.S.C. 154(b) by 0 days.

(21) Appl. No.: 16/584,867

(22) Filed: Sep. 26, 2019

(51) Int. Cl.
| | | |
|---|---|---|
| H04J 14/00 | (2006.01) | |
| H04L 7/10 | (2006.01) | |
| H04L 27/00 | (2006.01) | |
| H04J 14/02 | (2006.01) | |
| H04B 1/04 | (2006.01) | |
| H04B 10/2575 | (2013.01) | |

(52) U.S. Cl.
CPC ............ *H04L 7/10* (2013.01); *H04B 1/0475* (2013.01); *H04B 10/25753* (2013.01); *H04J 14/0221* (2013.01); *H04L 27/0002* (2013.01)

(58) Field of Classification Search
CPC .............. H04B 10/27; H04B 10/25753; H04B 10/2575; H04B 10/25752; H04B 1/0475; H03F 1/3247; H03F 1/3241; H04W 88/085; H04L 25/49; H04L 25/08; H04L 27/368
USPC ....... 398/66, 67, 68, 69, 70, 71, 72, 79, 115, 398/116, 117, 100, 193, 194; 375/296, 375/297, 295, 285; 455/114.3, 114.2, 455/67.13, 63.1, 115.1
See application file for complete search history.

(56) References Cited

U.S. PATENT DOCUMENTS

| | | |
|---|---|---|
| 8,149,950 B2 | 4/2012 | Kim et al. |
| 8,213,884 B2 | 7/2012 | Kim et al. |
| 8,224,266 B2 | 7/2012 | Liu et al. |
| 8,326,238 B2 | 12/2012 | Yang et al. |
| 8,351,877 B2 | 1/2013 | Kim et al. |
| 8,380,143 B2 | 2/2013 | Yang et al. |
| 8,467,747 B2 | 6/2013 | Kim et al. |
| 8,472,897 B1 | 6/2013 | Yang |
| 8,542,768 B2 | 9/2013 | Kim et al. |
| 8,693,962 B2 | 4/2014 | Liu et al. |
| 8,731,495 B2 | 5/2014 | Yang et al. |

(Continued)

*Primary Examiner* — Hanh Phan
(74) *Attorney, Agent, or Firm* — C. Keith Montgomery

(57) ABSTRACT

Digital predistortion (DPD) timing alignment in a remote unit(s) for a wireless communications system (WCS) is disclosed. In examples discussed herein, a remote unit includes a power amplifier (PA) configured to amplify a radio frequency (RF) signal before transmission. The RF signal may include an unwanted distortion term and a DPD circuit is provided in the remote unit to create an artificial distortion term to help cancel out the unwanted distortion term. The remote unit includes a DPD front-end circuit configured to generate a digital training signal corresponding to a predefined waveform pattern. The DPD circuit can be configured to perform a DPD timing alignment based on the predefined waveform pattern to determine a timing offset that is need to create the artificial distortion term. As such, it may be possible to effectively cancel the unwanted distortion term in the RF signal to improve efficiency and linearity of the PA.

24 Claims, 13 Drawing Sheets

(56) References Cited

U.S. PATENT DOCUMENTS

| | | | |
|---|---|---|---|
| 8,873,674 B2 | 10/2014 | Kim et al. | |
| 8,913,689 B2 | 12/2014 | Kim et al. | |
| 9,225,296 B2* | 12/2015 | Kim | H04L 25/03063 |
| 2010/0054364 A1* | 3/2010 | Cai | H04L 25/03885 |
| | | | 375/296 |
| 2012/0155572 A1* | 6/2012 | Kim | H03F 3/24 |
| | | | 375/297 |

* cited by examiner

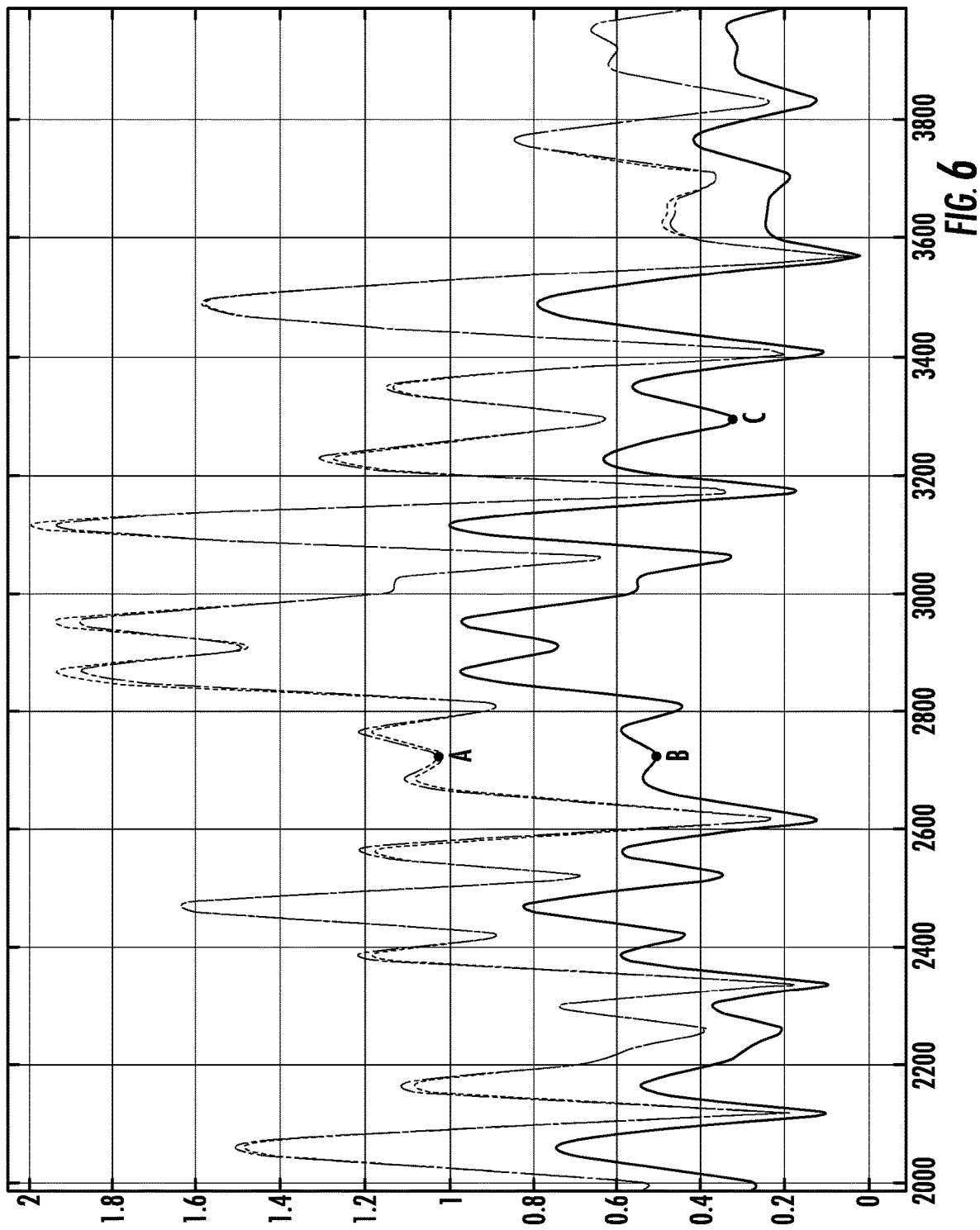

DIGITAL PREDISTORTION (DPD) TIMING ALIGNMENT IN A REMOTE UNIT(S) FOR A WIRELESS COMMUNICATIONS SYSTEM (WCS)

BACKGROUND

The disclosure relates generally to a remote unit(s) in a wireless communications system (WCS), such as a distributed communications system (DCS), configured to improve power amplifier efficiency and linearity via digital predistortion (DPD).

Wireless customers are increasingly demanding wireless communications services, such as cellular communications services and (Wireless Fidelity) Wi-Fi services. Thus, small cells, and more recently Wi-Fi services, are being deployed indoors. At the same time, some wireless customers use their wireless communications devices in areas that are poorly serviced by conventional cellular networks, such as inside certain buildings or areas where there is little cellular coverage. One response to the intersection of these two concerns has been the use of distributed antenna systems (DASs). DASs include remote antenna units (RAUs) configured to receive and transmit communications signals to client devices within the antenna range of the RAUs. DASs can be particularly useful when deployed inside buildings or other indoor environments where the wireless communications devices may not otherwise be able to effectively receive radio frequency (RF) signals from a source.

In this regard, FIG. 1 illustrates a WCS 100, such as a DCS, that is configured to distribute communications services to remote coverage areas 102(1)-102(N), where 'N' is the number of remote coverage areas. The WCS 100 in FIG. 1 is provided in the form of a wireless DCS, such as a DAS 104. The DAS 104 can be configured to support a variety of communications services that can include cellular communications services, wireless communications services, such as RF identification (RFID) tracking, Wi-Fi, local area network (LAN), and wireless LAN (WLAN), wireless solutions (Bluetooth, Wi-Fi Global Positioning System (GPS) signal-based, and others) for location-based services, and combinations thereof, as examples. The remote coverage areas 102(1)-102(N) are created by and centered on RAUs 106(1)-106(N) connected to a central unit 108 (e.g., a head-end controller, a central unit, or a head-end unit). The central unit 108 may be communicatively coupled to a source transceiver 110, such as for example, a base transceiver station (BTS) or a baseband unit (BBU). In this regard, the central unit 108 receives downlink communications signals 112D from the source transceiver 110 to be distributed to the RAUs 106(1)-106(N). The downlink communications signals 112D can include data communications signals and/or communication signaling signals, as examples. The central unit 108 is configured with filtering circuits and/or other signal processing circuits that are configured to support a specific number of communications services in a particular frequency bandwidth (i.e., frequency communications bands). The downlink communications signals 112D are communicated by the central unit 108 over a communications link 114 over their frequency to the RAUs 106(1)-106(N).

With continuing reference to FIG. 1, the RAUs 106(1)-106(N) are configured to receive the downlink communications signals 112D from the central unit 108 over the communications link 114. The downlink communications signals 112D are configured to be distributed to the respective remote coverage areas 102(1)-102(N) of the RAUs 106(1)-106(N). The RAUs 106(1)-106(N) are also configured with filters and other signal processing circuits that are configured to support all or a subset of the specific communications services (i.e., frequency communications bands) supported by the central unit 108. In a non-limiting example, the communications link 114 may be a wired communications link, a wireless communications link, or an optical fiber-based communications link. Each of the RAUs 106(1)-106(N) may include an RF transmitter/receiver 116(1)-116(N) and a respective antenna 118(1)-118(N) operably connected to the RF transmitter/receiver 116(1)-116(N) to wirelessly distribute the communications services to user equipment (UE) 120 within the respective remote coverage areas 102(1)-102(N). The RAUs 106(1)-106(N) are also configured to receive uplink communications signals 112U from the UE 120 in the respective remote coverage areas 102(1)-102(N) to be distributed to the source transceiver 110.

Because the RAUs 106(1)-106(N) include components that require power to operate, such as the RF transmitters/receivers 116(1)-116(N) for example, it is necessary to provide power to the RAUs 106(1)-106(N). In one example, each RAU 106(1)-106(N) may receive power from a local power source. In another example, the RAUs 106(1)-106(N) may be powered remotely from a remote power source(s). For example, the central unit 108 in the WCS 100 in FIG. 1 includes a power source 122 that is configured to remotely supply power over the communications links 114 to the RAUs 106(1)-106(N). For example, the communications links 114 may be cable that includes electrical conductors for carrying current (e.g., direct current (DC)) to the RAUs 106(1)-106(N). If the WCS 100 is an optical fiber-based DCS in which the communications links 114 include optical fibers, the communications links 114 may by a "hybrid" cable that includes optical fibers for carrying the downlink and uplink communications signals 112D, 112U and separate electrical conductors for carrying current to the RAUs 106(1)-106(N).

The RAUs 106(1)-106(N) in the DAS 104 are typically required to distribute the downlink communications signals 112D at a required power level (e.g., up to 80 watts) such that the downlink communications signals 112D can reach as many UE 120 as possible in the remote coverage areas 102(1)-102(N). As such, each of the RAUs 106(1)-106(N) may employ a power amp lifer(s) (PA(s)) to amplify the downlink communications signals 112D to the required power level before transmitting the downlink communications signals 112D to the UE 120.

No admission is made that any reference cited herein constitutes prior art. Applicant expressly reserves the right to challenge the accuracy and pertinency of any cited documents.

SUMMARY

Embodiments disclosed herein include digital predistortion (DPD) timing alignment in a remote unit(s) for a wireless communications system (WCS). In examples discussed herein, a remote unit includes a power amplifier (PA) configured to amplify a radio frequency (RF) signal before transmission. Notably, the PA may cause an unwanted distortion term, such as third-order intermodulation distortion (IMD3), in the amplified RF signal. Consequently, the remote unit may fail to satisfy such regulatory and/or operational requirements as adjacent channel power ratio (ACPR) and IMD3. To help reduce the unwanted distortion term in the RF signal, a DPD circuit may be provided in the remote unit to add an artificial distortion term, which has an opposite phase relative to the unwanted distortion term, into a digital signal before converting the digital signal into the RF signal. Accordingly, the artificial distortion term can cancel the unwanted distortion term when the RF signal is amplified by the PA. To create the artificial distortion term having the opposite phase of the unwanted distortion term, the DPD circuit needs to accurately determine a timing offset between the digital signal and a feedback signal, which includes a digital representation of the unwanted distortion term. In a non-limiting example, the DPD circuit can determine the timing offset by comparing waveform similarity between the digital signal and the feedback signal.

In this regard, to help the DPD circuit to accurately determine the timing offset, particularly when the digital signal is a periodic signal, a DPD front-end circuit is provided in the remote unit. The DPD front-end circuit includes a training signal generation circuit configured to generate a digital training signal corresponding to a predefined waveform pattern (e.g., a non-periodic waveform pattern). Accordingly, the DPD circuit can perform a DPD timing alignment based on the predefined waveform pattern to accurately determine and store the timing offset, which can be used to generate the artificial distortion term to cancel the unwanted distortion term, either during test or in live operation. By including the DPD front-end circuit to provide the digital training signal having the predefined waveform pattern, it may be possible to effectively cancel the unwanted distortion term in the RF signal, thus helping to improve efficiency and linearity of the PA in the remote unit.

One exemplary embodiment of the disclosure relates to a DPD front-end circuit in a remote unit for a wireless communications system (WCS). The DPD front-end circuit includes an input port configured to receive a digital input signal. The DPD front-end circuit also includes an output port coupled to a DPD circuit. The DPD front-end circuit also includes a training signal generation circuit configured to generate a digital training signal corresponding to a predefined waveform pattern. The DPD front-end circuit also includes a multiplexer circuit configured to selectively provide one of the digital input signal and the digital training signal to the output port. The DPD front-end circuit also includes a control circuit configured to cause the multiplexer circuit to provide the digital training signal to the output port in response to receiving a DPD training indication signal such that the DPD circuit can perform a DPD timing alignment based on the digital training signal.

An additional exemplary embodiment of the disclosure relates to a remote unit for a WCS. The remote unit includes a DPD circuit. The remote unit also includes a DPD front-end circuit. The DPD front-end circuit includes an input port configured to receive a digital input signal. The DPD front-end circuit also includes an output port coupled to the DPD circuit. The DPD front-end circuit also includes a training signal generation circuit configured to generate a digital training signal corresponding to a predefined waveform pattern. The DPD front-end circuit also includes a multiplexer circuit configured to selectively provide one of the digital input signal and the digital training signal to the output port. The DPD front-end circuit also includes a control circuit configured to cause the multiplexer circuit to provide the digital training signal to the output port in response to receiving a DPD training indication signal such that the DPD circuit can perform a DPD timing alignment based on the digital training signal.

An additional exemplary embodiment of the disclosure relates to a WCS. The WCS includes a central unit. The WCS also includes a plurality of remote units coupled to the central unit via a plurality of communications mediums. The central unit is configured to communicate a plurality of downlink communications signals and a plurality of uplink communications signals with the plurality of remote units over the plurality of communications mediums. At least one of the plurality of remote units includes a DPD circuit. The at least one of the plurality of remote units also includes a DPD front-end circuit. The DPD front-end circuit includes an input port configured to receive a digital input signal. The DPD front-end circuit also includes an output port coupled to the DPD circuit. The DPD front-end circuit also includes a training signal generation circuit configured to generate a digital training signal corresponding to a predefined waveform pattern. The DPD front-end circuit also includes a multiplexer circuit configured to selectively provide one of the digital input signal and the digital training signal to the output port. The DPD front-end circuit also includes a control circuit configured to cause the multiplexer circuit to provide the digital training signal to the output port in response to receiving a DPD training indication signal such that the DPD circuit can perform a DPD timing alignment based on the digital training signal.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 6 is a graphic diagram providing an exemplary illustration of a predefined waveform pattern (e.g., non-periodic waveform pattern) generated by a waveform generator in the training signal generation circuit in FIG. 5;

DETAILED DESCRIPTION

Embodiments disclosed herein include a digital predistortion (DPD) timing alignment in a remote unit(s) for a wireless communications system (WCS). In examples discussed herein, a remote unit includes a power amplifier (PA) configured to amplify a radio frequency (RF) signal before transmission. Notably, the PA may cause an unwanted distortion term, such as third-order intermodulation distortion (IMD3), in the amplified RF signal. Consequently, the remote unit may fail to satisfy such regulatory and/or operational requirements as adjacent channel power ratio (ACPR) and IMD3. To help reduce the unwanted distortion term in the RF signal, a DPD circuit may be provided in the remote unit to add an artificial distortion term, which has an opposite phase relative to the unwanted distortion term, into a digital signal before converting the digital signal into the RF signal. Accordingly, the artificial distortion term can cancel the unwanted distortion term when the RF signal is amplified by the PA. To create the artificial distortion term having the opposite phase of the unwanted distortion term, the DPD circuit needs to accurately determine a timing offset between the digital signal and a feedback signal, which includes a digital representation of the unwanted distortion term. In a non-limiting example, the DPD circuit can determine the timing offset by comparing waveform similarity between the digital signal and the feedback signal.

In this regard, to help the DPD circuit to accurately determine the timing offset, particularly when the digital signal is a periodic signal, a DPD front-end circuit is provided in the remote unit. The DPD front-end circuit includes a training signal generation circuit configured to generate a digital training signal corresponding to a predefined waveform pattern (e.g., a non-periodic waveform pattern). Accordingly, the DPD circuit can perform a DPD timing alignment based on the predefined waveform pattern to accurately determine and store the timing offset, which can be used to generate the artificial distortion term to cancel the unwanted distortion term, either during test or in live operation. By including the DPD front-end circuit to provide the digital training signal having the predefined waveform pattern, it may be possible to effectively cancel the unwanted distortion term in the RF signal, thus helping to improve efficiency and linearity of the PA in the remote unit.

Figure 1:
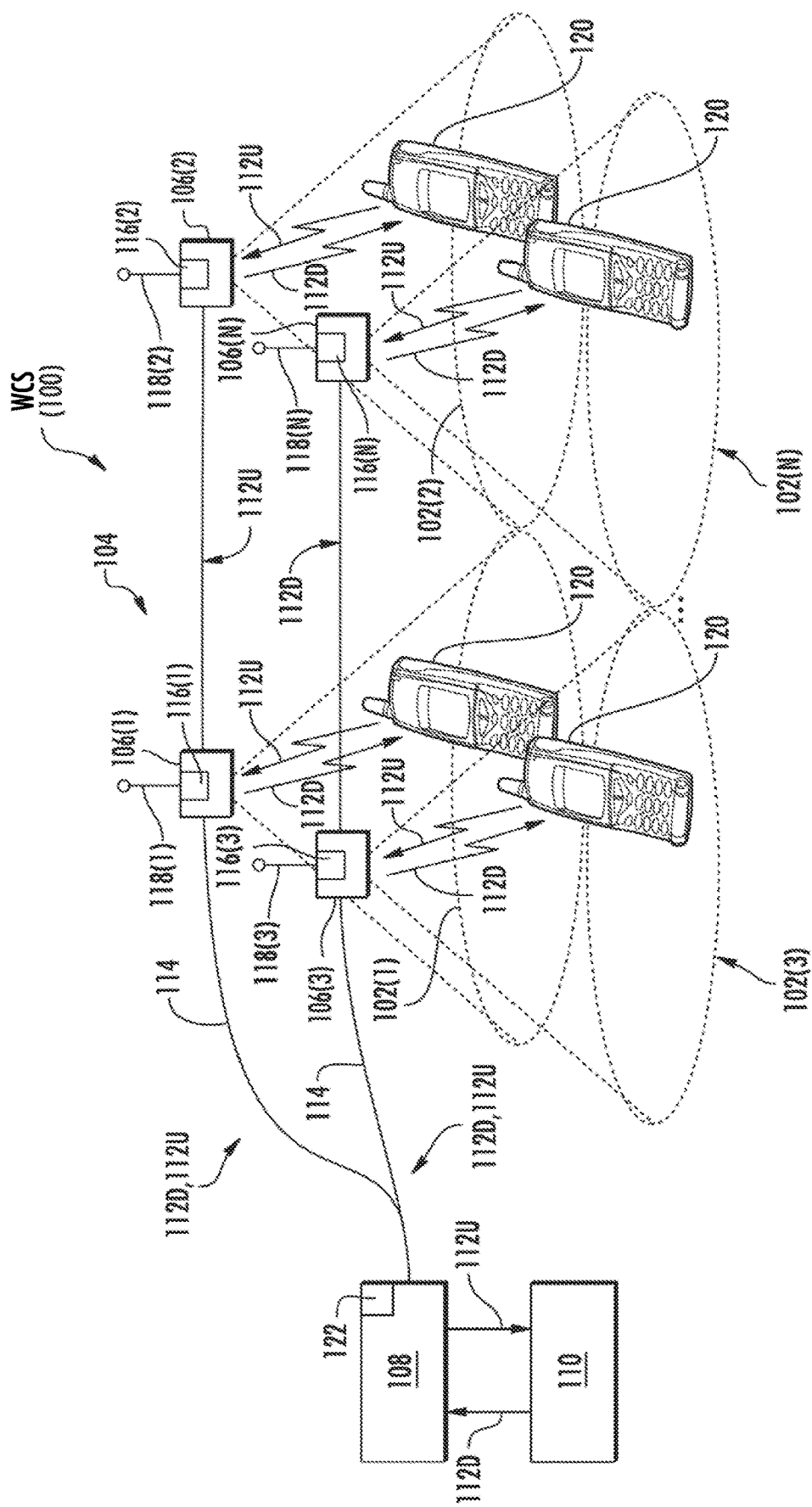
FIG. 1 is a schematic diagram of an exemplary wireless communications system (WCS), such as a distributed communications system (DCS), configured to distribute communications services to remote coverage areas.
Figure 2A:
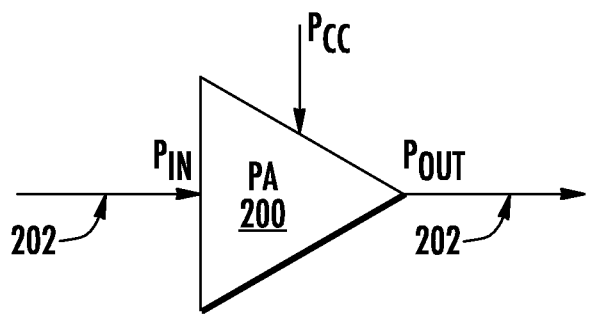
FIG. 2A is a schematic diagram of an exemplary power amplifier (PA) configured to amplify a radio frequency (RF) signal from an input power to an output power based on a direct current (DC) supply power.
Figure 2B:
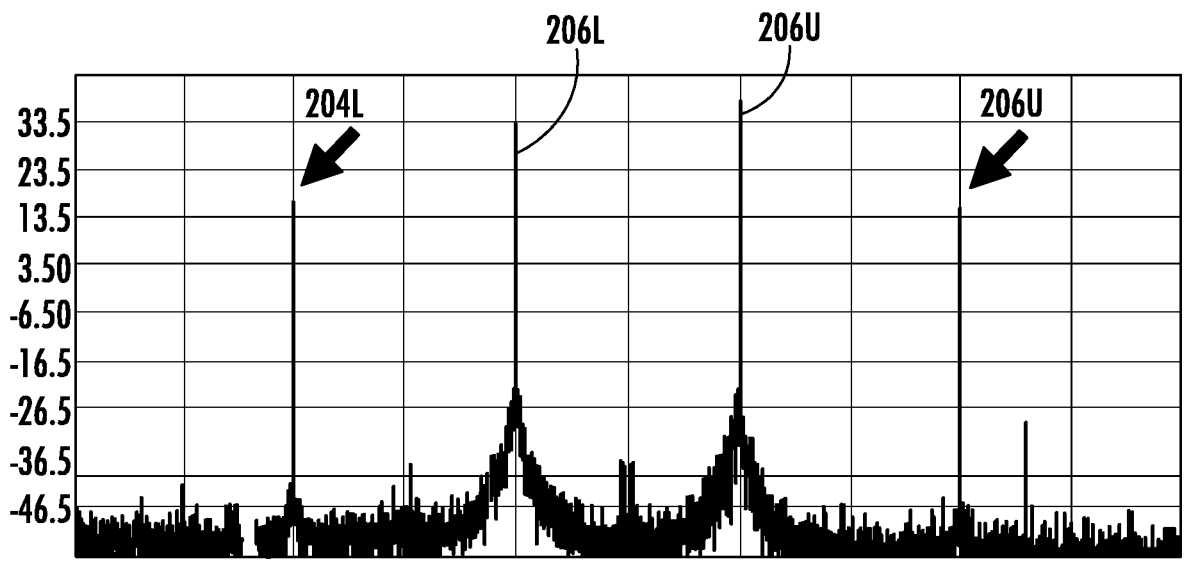
FIG. 2B is a graphic diagram providing an exemplary illustration of a pair of third-order intermodulation distortions (IMD3s) that the PA of FIG. 2A may create when amplifying the RF signal from the input power to the output power.
Figure 2C:
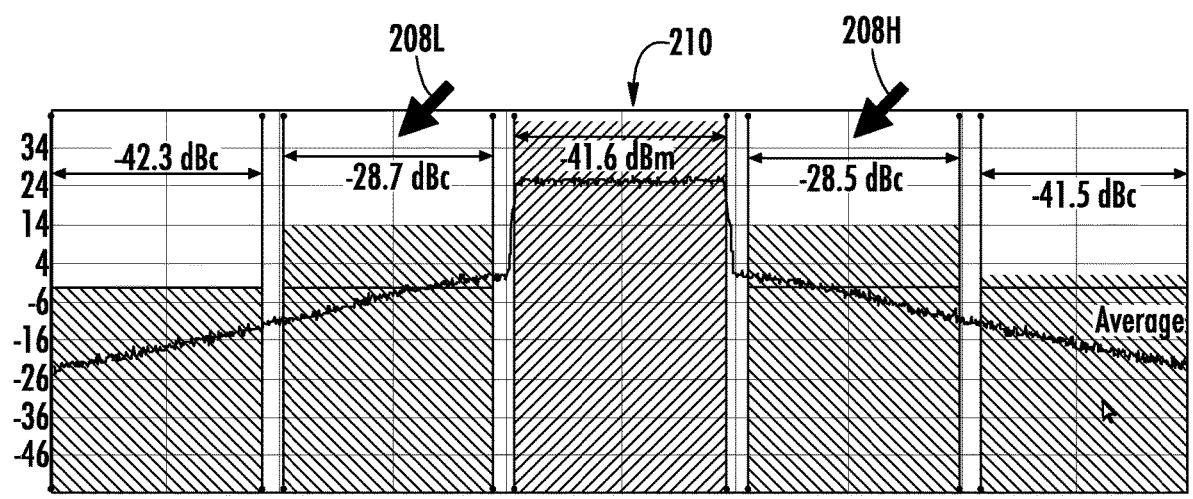
FIG. 2C is a graphic diagram providing an exemplary illustration of an adjacent channel power ratio (ACPR) measurement in a pair of adjacent channels and outside a wanted channel in which the RF signal of FIG. 2A is modulated.

Before discussing a DPD front-end circuit and the remote unit incorporating the DPD front-end circuit of the present disclosure, a brief overview of a power amplifier is first provided with reference to FIGS. 2A-2C to help understand key performance metrics of the power amplifier. A discussion of a conventional DPD circuit is then provided with reference to FIGS. 3A-3B to help understand how DPD can improve the key performance metrics of the power amplifier. The discussion of specific exemplary aspects of a DPD front-end circuit and a remote unit incorporating the DPD front-end circuit of the present disclosure starts below with reference to FIG. 4.

FIG. 2A is a schematic diagram of an exemplary power amplifier (PA) 200 configured to amplify an RF signal 202 from an input power $P_{IN}$ to an output power $P_{OUT}$ based on a direct current (DC) supply power $P_{CC}$. Notably, the most important figure of merit for the PA 200 includes PA efficiency and PA linearity.

The PA efficiency, which is a measure of the DC supply power $P_{CC}$ required by the PA 200 to amplify the RF signal 202 to the output power $P_{OUT}$, can be determined based on equation (Eq. 1) below.

$$\text{PA Efficiency (\%)} = 100 * P_{OUT}/P_{CC} \quad \text{(Eq. 1)}$$

The PA linearity is a measure of unwanted distortion terms being added to the RF signal 202 when the PA 200 amplifies the RF signal 202 from the input power $P_{IN}$ to the output power $P_{OUT}$. The PA linearity may be measured based on a set of metrics, namely third-order intermodulation distortion (IMD3), adjacent channel power ratio (ACPR), and output power saturation point (OPsat).

When the RF signal 202 is a two-tone signal, which includes two RF signals located at two adjacent frequency bands/channels (e.g., 1962.5 MHz with 2 MHz channel spacing), the PA 200 may create the IMD3 outside the adjacent frequency bands/channels of the two-tone signal. In this regard, FIG. 2B is a graphic diagram providing an exemplary illustration of a pair of IMD3s 204L and 204U that the PA 200 of FIG. 2A may create when amplifying the RF signal 202 from the input power $P_{IN}$ to the output power Pour.

The RF signal 202 can correspond to a lower tone 206L and an upper tone 206U. The PA 200 creates the IMD3s 204L and 204U outside the lower tone 206L and the upper tone 206l, respectively. In a non-limiting example, the RF signal 202 may have a peak signal amplitude of 38.676 dBm, while the IMD3s 204L and 204U can have a peak IMD3 amplitude of 16.235 dBm.

The ACPR is designed to measure PA linearity when the RF signal 202 is a modulated signal. Specifically, the ACPR measures the unwanted distortion terms that the PA 200 creates in adjacent channels outside a wanted channel in which the RF signal 202 is modulated. In this regard, FIG. 2C is a graphic diagram providing an exemplary illustration of ACPR measurements in a pair of adjacent channels 208L and 208U outside of a wanted channel 210 in which the RF signal 202 of FIG. 2A is modulated. In a non-limiting example, the RF signal 202 in the wanted channel 210 can have a peak power of 41.6 dBm, while the ACPR in the adjacent channels 208L and 208U can be as high as 13.17 dBm.

The OPsat reflects a maximum of the output power $P_{OUT}$ the PA 200 can achieve. When the PA 200 operates above the OPsat, the output power $P_{OUT}$ does not increase in proportion to an increase of the input power $P_{IN}$. In this regard, the PA 200 is saturated and can suffer a decreased PA gain as a result.

When the PA 200 is provided in a small formfactor device (e.g., a smartphone), it may be desired for the PA 200 to have a higher efficiency to help reduce power consumption in the small formfactor device. In contrast, in a higher power device (e.g., a remote unit), the PA 200 may be further required to exhibit higher linearity such that the higher power device can satisfy stringent regulatory and/or industrial requirements, such as IMD3 and ACPR, in addition to conserve power. However, a higher PA efficiency is often achieved at an expense of PA linearity, and vice versa. As such, it may be desired to configure the PA 200 to operate with higher PA efficiency, while improving PA linearity by means of DPD.

Figure 3A:
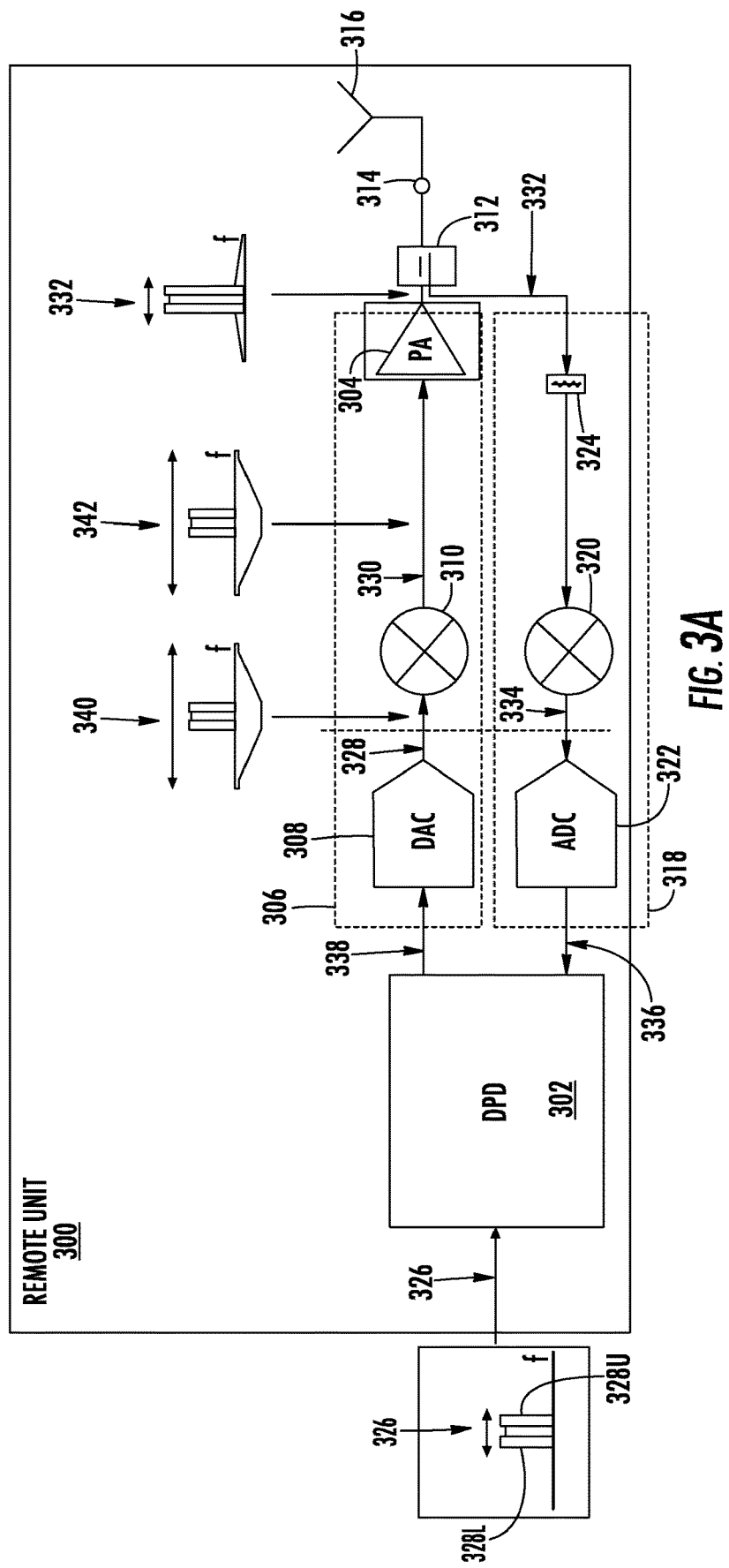
FIG. 3A is a schematic diagram of an exemplary existing remote unit including a digital predistortion (DPD) circuit configured to improve linearity performance (e.g., IMD3 and ACPR) of a PA.

In this regard, FIG. 3A is a schematic diagram of an exemplary existing remote unit 300 including a DPD circuit 302 configured to improve linearity performance (e.g., IMD3 and ACPR) of a PA 304. The DPD circuit 302 is coupled to a signal path 306. The signal path 306 includes a digital-to-analog converter (DAC) 308 coupled to the DPD circuit 302, a downlink signal frequency conversion circuit 310 (e.g., a frequency up-conversion circuit) coupled to the DAC 308, and the PA 304. The PA 304 is coupled between the downlink signal frequency conversion circuit 310 and a coupler 312. The coupler 312 is coupled to an antenna port 314 configured to connect to an antenna 316.

The existing remote unit 300 also includes a feedback path 318. The feedback path 318 includes a feedback signal frequency conversion circuit 320 (e.g., a frequency down-conversion circuit) coupled to the coupler 312 and an analog-to-digital converter (ADC) 322 coupled between the feedback signal frequency conversion circuit 320 and the DPD circuit 302. The feedback path 318 may include an attenuator 324 coupled between the coupler 312 and the feedback signal frequency conversion circuit 320.

The existing remote unit 300 receives a digital input signal 326 that includes a lower tone 328L and an upper tone 328U. The digital input signal 326 can be a test signal when the existing remote unit 300 is undergoing a factor or a field test or a downlink digital communications signal when the existing remote unit 300 is in operation.

If the DPD circuit 302 and the feedback path 318 are not provided in the existing remote unit 300, the DAC 308 will receive and convert the digital input signal 326 into an intermediate frequency (IF) signal 328, the downlink signal frequency conversion circuit 310 will receive and convert the IF signal 328 into an RF signal 330, and the PA 304 will receive and amplify the RF signal 330 to generate an amplified RF signal 332. As previously discussed in FIGS. 2A-2C, the PA 304 may be inherently nonlinear. As a result, the PA 304 may create at least one unwanted distortion term, such as the IMD3 204L and 204U in FIG. 2B in the amplified RF signal 332, which can cause a worsened ACPR in channels adjacent to the lower tone 328L and/or the upper tone 328U, such as the adjacent channels 208L and 208U in FIG. 2C.

In contrast, with the DPD circuit 302 and the feedback path 318, the feedback signal frequency conversion circuit 320 receives a replica of the amplified RF signal 332 that includes the unwanted distortion term via the coupler 312. If the attenuator 324 is also provided in the feedback path 318, the attenuator 324 may be configured to attenuate the replica of the amplified RF signal 332. The feedback signal frequency conversion circuit 320 converts the replica of the amplified RF signal 332 into an IF feedback signal 334. The ADC 322 receives and converts the IF feedback signal 334 into a digital feedback signal 336, which understandably includes a digital representation of the unwanted distortion term.

The DPD circuit 302 receives the digital input signal 326 and the digital feedback signal 336. The DPD circuit 302 may be configured to analyze the digital representation of the unwanted distortion term received in the digital feedback signal 336 to obtain such information as phase and amplitude of the unwanted distortion term. Accordingly, the DPD circuit 302 may digitally process the digital input signal 326 to generate a predistorted digital signal 338. More specifically, based on the information the DPD circuit 302 has obtained about the unwanted distortion term via the digital feedback signal 336, the DPD circuit may add an artificial distortion term, which has a substantially similar amplitude and a substantially opposing phase relative to the amplitude and phase of the unwanted distortion term, into the predistorted digital signal 338. The DAC 308 receives and converts the predistorted digital signal 338 into a predistorted IF signal 340, which understandably includes the artificial distortion term. The downlink signal frequency conversion circuit 310 receives and converts the predistorted IF signal 340 into a predistorted RF signal 342, which understandably includes the artificial distortion term. The PA 304 receives and amplifies the predistorted RF signal 342 to generate the amplified RF signal 332. Given that the predistorted RF signal 342 includes the artificial distortion term having the substantially similar amplitude and the substantially opposing phase relative to the unwanted distortion term the PA 304 would create during amplification of the predistorted RF signal 342, the unwanted distortion term may be sufficiently canceled out in the amplified RF signal 332.

In this regard, to be able to sufficiently cancel out the unwanted distortion term in the amplified RF signal 332, the DPD circuit 302 must create the artificial distortion term with the substantially similar amplitude and the substantially opposing phase relative to the unwanted distortion term. As discussed above, the DPD circuit 302 relies on the digital feedback signal 336 to obtain the amplitude and phase information about the unwanted distortion term. Notably, the signal path 306 and the feedback path 318 can have respective group delays that are unknown to the DPD circuit 302.

In a non-limiting example, the group delays can be determined based on equation (Eq. 2) below.

$$\text{Group Delay} = -d\theta/d\omega \quad \text{(Eq. 2)}$$

In the equation (Eq. 2) above, $\theta$ represents phase delay in degree units and $\omega$ corresponds to frequency of the signal in units of radius/second. The equation (Eq. 2) indicates that the group delays associated with the signal path 306 and the feedback path 318 can cause phase misalignment between the artificial distortion term and the unwanted distortion term, thus compromising effectiveness of the artificial distortion term in cancelling the unwanted distortion term at the PA 304. As such, the DPD circuit 302 needs to accurately determine a timing offset (e.g., phase differential) between the digital input signal 326 and the digital feedback signal 336 such that the DPD circuit 302 can create the artificial distortion term having the substantially similar amplitude and the substantially opposing phase relative to the unwanted distortion term.

In a non-limiting example, the DPD circuit 302 can be configured to determine the timing offset by exploring waveform similarity between the digital input signal 326 and the digital feedback signal 336. However, as discussed next in FIG. 3B, it may be difficult to unambiguously determine the waveform similarity if the digital input signal 326 and the digital feedback signal 336 correspond to periodic waveforms (e.g., sinusoid waveform). In this regard, FIG. 3B is a graphic diagram providing an exemplary illustration of a periodic input signal waveform 344 and a periodic feedback signal waveform 346 that correspond to the digital input signal 326 and the digital feedback signal 336 in FIG. 3A.

Figure 3B:
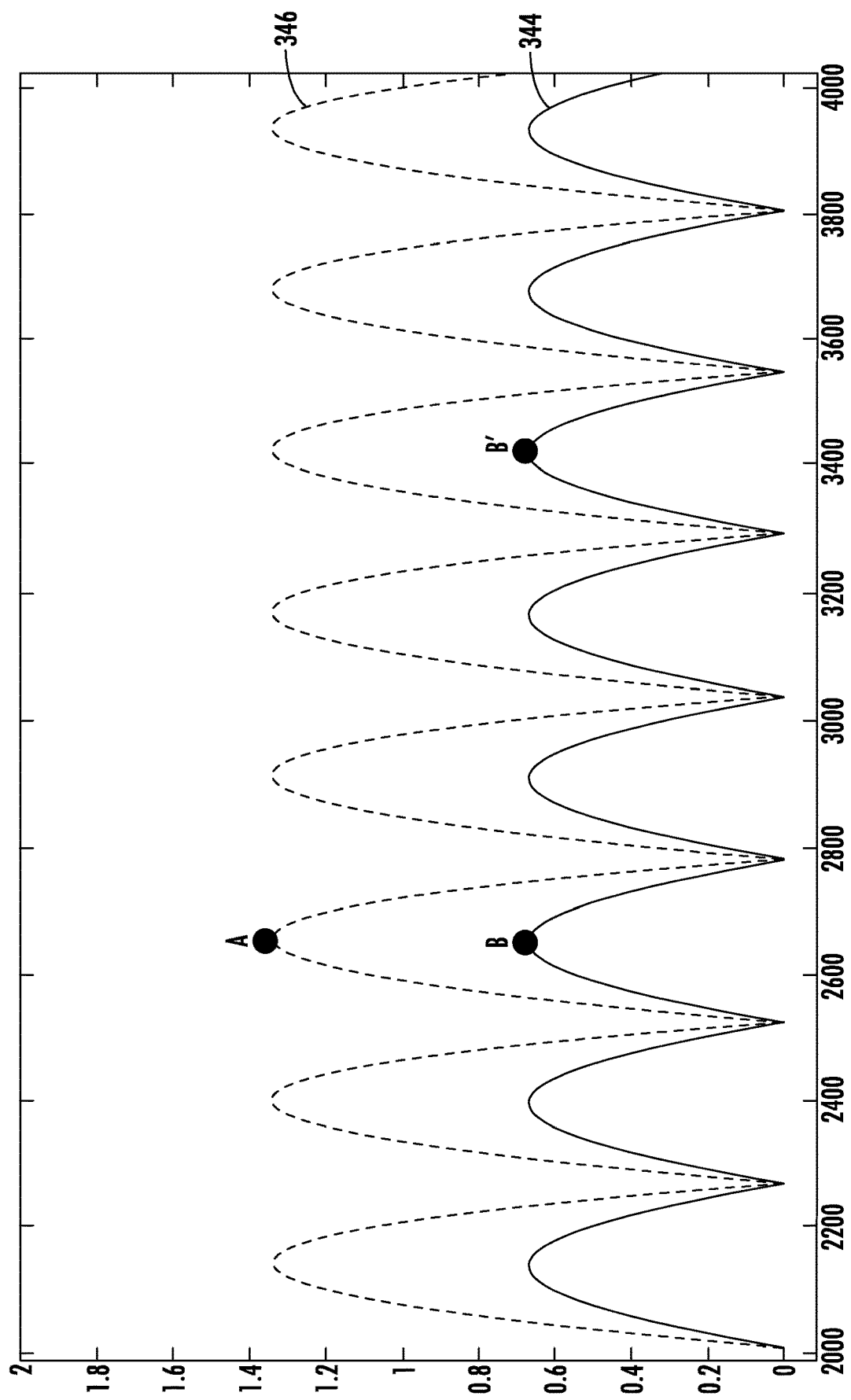
FIG. 3B is a graphic diagram providing an exemplary illustration of a periodic input signal waveform and a periodic feedback signal waveform, which can create difficulty for the DPD circuit in FIG. 3A to accurately perform a timing alignment that is required to improve linearity performance of the PA.

As illustrated in FIG. 3B, the DPD circuit 302 may have difficulty in unambiguously determining whether the timing offset should be determined based on points A and B or points A and B'. As a result, the DPD circuit 302 may not be able to create the artificial distortion term to have the substantially opposing phase relative to the unwanted distortion term, thus hindering the ability of the DPD circuit 302 to effectively cancel out the unwanted distortion term at the PA 304. Hence, it may be desirable to optimize the existing remote unit 300 such that the DPD circuit 302 can unambiguously determine the timing offset between the digital input signal 326 and the digital feedback signal 336 even if the digital input signal 326 and the digital feedback signal 336 correspond to periodic waveforms.

Figure 4:
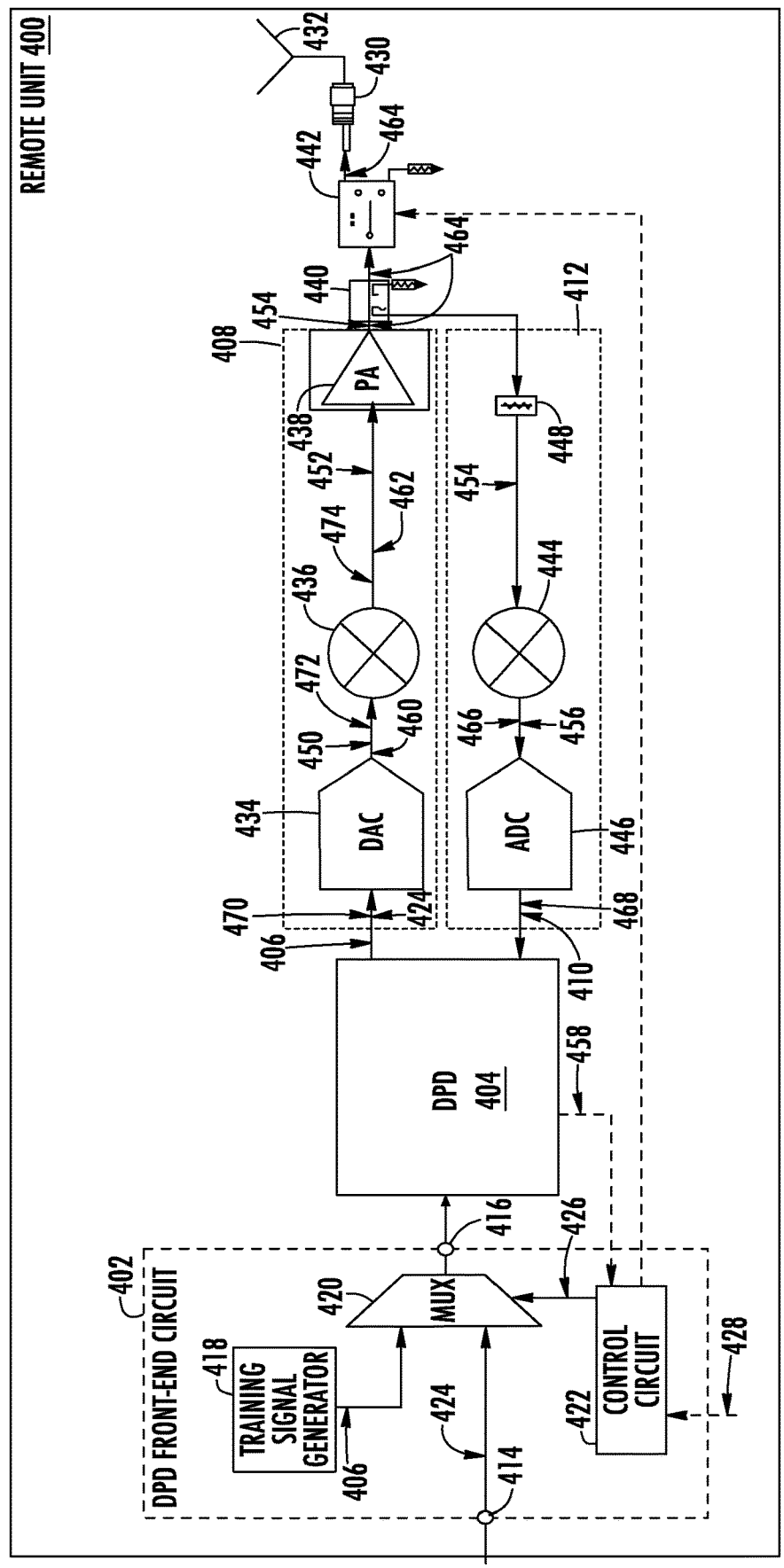
FIG. 4 is a schematic diagram of an exemplary remote unit including a DPD front-circuit configured according to an embodiment of the present disclosure to enable a DPD circuit to accurately determine a timing offset for effective distortion cancellation in the remote unit.

In this regard, FIG. 4 is a schematic diagram of an exemplary remote unit 400 including a DPD front-end circuit 402 configured according to an embodiment of the present disclosure to enable a DPD circuit 404 to accurately determine a timing offset for effective distortion cancellation in the remote unit 400. As discussed in detail below, the remote unit 400 is configured to undergo a DPD training process prior to being tested or commissioned for live service. During the training phase, the DPD front-end circuit 402 is configured to provide a digital training signal 406 corresponding to a predefined waveform pattern (e.g., a non-periodic waveform pattern) to the DPD circuit 404. The digital training signal 406 propagates through a signal path 408 and returns to the DPD circuit 404 as a digital feedback signal 410 via a feedback path 412. Accordingly, the DPD circuit 404 may be able to accurately determine the timing offset between the digital training signal 406 and the digital feedback signal 410 by unambiguously matching the predefined waveform pattern corresponding to the digital training signal 406 and the digital feedback signal 410. The DPD circuit 404 may thus store the timing offset (e.g., in a non-volatile memory) to be used later when the remote unit 400 undergoes a factory/field test or is commissioned for live service. By determining the timing offset based on the digital training signal 406 having the predefined waveform pattern, it may be possible to eliminate ambiguity in determining the timing offset, thus helping to enable effective distortion cancelation in the remote unit 400. As a result, it may be possible for the remote unit 400 to satisfy more stringent regulatory and/or industrial requirements, such as IMD3 and ACPR requirements.

In a non-limiting example, the DPD front-end circuit 402 includes an input port 414, an output port 416 coupled to the DPD circuit 404, a training signal generation circuit 418 (denoted as "TRAINING SIGGEN"), a multiplexer circuit 420 (denoted as "MUX") coupled to the input port 414, the output port 416, and the training signal generation circuit 418, and a control circuit 422 coupled to the multiplexer circuit 420. The input port 414 is configured to receive a digital input signal 424, which can be a digital test signal when the remote unit 400 undergoes the factory/field test or a downlink digital communications signal when the remote unit 400 is commissioned for live service. The training signal generation circuit 418 is configured to generate the digital training signal 406 corresponding to the predefined waveform pattern. The multiplexer circuit 420 is configured to selectively provide one of the digital training signal 406 and the digital input signal 424 to the output port 416. The control circuit 422, which can be a field-programmable gate array (FPGA) for example, is configured to cause the multiplexer circuit 420 (e.g., via a control signal 426) to provide the digital training signal 406 to the output port 416 such that the DPD circuit 404 can undergo the training process to determine and store the timing offset between the digital training signal 406 and the digital feedback signal 410. As an example, the control circuit 422 may cause the multiplexer circuit 420 to provide the digital training signal 406 to the output port 416 in response to receiving a DPD training indication signal 428 (e.g., from an external computer coupled to the control circuit 422). Concurrent to causing the multiplexer circuit 420 to provide the digital training signal 406 to the output port 416, the control circuit 422 may cause the multiplexer circuit 420 to block the digital input signal 424 from the output port 416.

Figure 5:
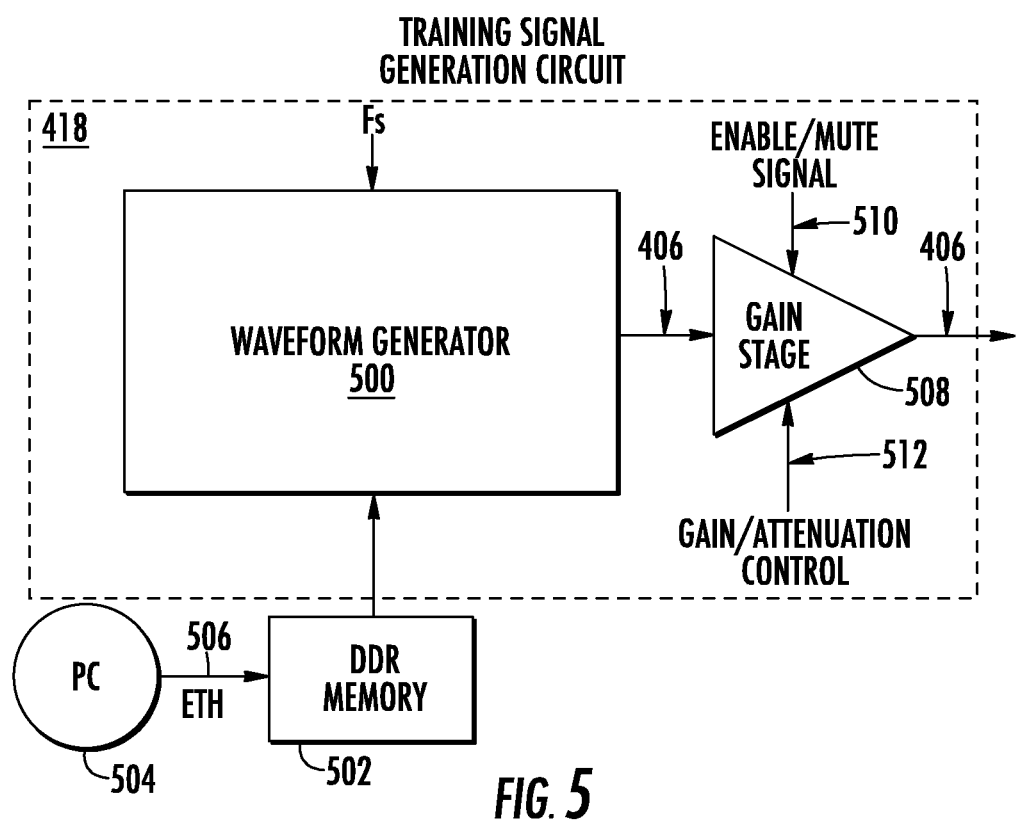
FIG. 5 is a schematic diagram providing an exemplary illustration of a training signal generation circuit provided in the DPD front-end circuit in FIG. 4 for generating a digital training signal corresponding to a predefined waveform pattern.

FIG. 5 is a schematic diagram providing an exemplary illustration of the training signal generation circuit 418 configured according to an embodiment of the present disclosure. Common elements between FIGS. 4 and 5 are shown therein with common element numbers and will not be re-described herein.

The training signal generation circuit 418 includes a waveform generator 500 configured to generate the digital training signal 406 having the predefined waveform pattern. In a non-limiting example, the waveform generator 500 can be configured to generate the digital training signal 406 based on a waveform file that is prestored in a memory device 502, which can be a double data rate (DDR) memory device. For example, the waveform file can be prestored in the memory device by a personal computer (PC) 504 connected to the memory device 502 via an Ethernet (ETH) cable 506.

The training signal generation circuit 418 may include a gain controller 508 configured to adjust an amplitude of the digital training signal 406. The gain controller 508 may be enabled/disabled based on an enable/mute signal 510. The gain controller 508 may also be controlled by a gain/attenuation control signal 512 to adjust the amplitude of the digital training signal 406. The enable/mute signal 510 and the gain/attenuation control signal 512 may be provided by the control circuit 422 in FIG. 4 or by the PC 504.

FIG. 6 is a graphic diagram providing an exemplary illustration of the predefined waveform pattern (e.g., non-periodic waveform pattern) generated by the waveform generator 500 in FIG. 5. Given that the predefined waveform pattern is non-periodic, it may be possible for the DPD circuit 404 to unambiguously match point A with point B, as opposed to matching point A with point C. As a result, the DPD circuit 404 in the remote unit 400 of FIG. 4 may be able to accurately determine the timing offset between the digital training signal 406 and the digital feedback signal 410.

With reference back to FIG. 4, the remote unit 400 includes an antenna port 430 coupled to an antenna 432. The signal path 408 includes a DAC 434 coupled to the DPD circuit 404, a downlink signal frequency conversion circuit 436 (e.g., a frequency up-conversion circuit) coupled to the DAC 434, and a PA 438 coupled to the downlink signal frequency conversion circuit 436. The PA 438 is coupled to a coupler 440, which may be coupled to the antenna port 430 either directly or via a switching circuit 442.

The feedback path 412 includes a feedback signal frequency conversion circuit 444 (e.g., a frequency down-conversion circuit) coupled to the coupler 440 and an ADC 446 coupled between the feedback signal frequency conversion circuit 444 and the DPD circuit 404. The feedback path 412 may also include an attenuator 448 coupled between the coupler 440 and the feedback signal frequency conversion circuit 444.

During the training process, the control circuit 422 may control the switching circuit 442 to decouple the coupler 440 from the antenna port 430 in response to receiving the DPD training indication signal 428. The DPD circuit 404 receives the digital training signal 406 from the output port 416 and provides the digital training signal 406 to the DAC 434. The DAC 434 converts the digital training signal 406 into an IF training signal 450. The downlink signal frequency conversion circuit 436 receives and converts the IF training signal 450 into an RF training signal 452. The PA 438 receives and amplifies the RF training signal 452 to generate an amplified RF training signal 454. The coupler 440 receives and couples the amplified RF training signal 454 to the feedback path 412. The feedback signal frequency conversion circuit 444 receives and converts the amplified RF training signal 454 into an IF feedback signal 456. The ADC 446 receives and converts the IF feedback signal 456 into the digital feedback signal 410. The DPD circuit 404 is then configured to determine and store the timing offset between the digital training signal 406 and the digital feedback signal 410 based on the predefined waveform pattern. The stored timing offset can be used later when the remote unit 400 undergoes factory/field test or is commissioned for live service. In a non-limiting example, the control circuit 422 can receive a DPD training completion indication signal 458 from the DPD circuit 404 when the DPD circuit 404 completes the training process successfully.

For example, the remote unit 400 often needs to undergo factory/field tests to verify that the remote unit 400 can satisfy the often stringent regulatory/industrial requirements (e.g., IMD3 and ACPR) prior to being commissioned for live service. In this regard, the control circuit 422 may disable the training signal generation circuit 418 and cause the multiplexer circuit 420 to provide the digital input signal 424, which can be a two-tone digital test signal, to the output port 416, in response to receiving the DPD training completion indication signal 458. The control circuit 422 may also control the switching circuit 442 to couple the coupler 440 to the antenna port 430.

During the factory/field test, the DPD circuit 404 receives the digital input signal 424 from the output port 416 and provides the digital input signal 424 to the DAC 434. The DAC 434 converts the digital input signal 424 into an IF test signal 460. The downlink signal frequency conversion circuit 436 receives and converts the IF test signal 460 into an RF test signal 462. The PA 438 receives and amplifies the RF test signal 462 to generate an amplified RF test signal 464, which understandably includes the unwanted distortion term as previously described. The coupler 440 receives and couples the amplified RF test signal 464 to the feedback path 412. The feedback signal frequency conversion circuit 444 receives and converts the amplified RF test signal 464 into an IF test feedback signal 466. The ADC 446 receives and converts the IF test feedback signal 466 into a digital test feedback signal 468. The DPD circuit 404 is then configured to generate a predistorted digital test signal 470 including the artificial distortion term based on the digital input signal 424, the digital test feedback signal 468, and the stored timing offset obtained during the DPD timing alignment.

The DAC 434 subsequently converts the predistorted digital test signal 470 into a predistorted IF test signal 472. The downlink signal frequency conversion circuit 436 subsequently converts the predistorted IF test signal 472 into a predistorted RF test signal 474. The PA 438 subsequently amplifies the predistorted RF test signal 474 to generate the amplified RF test signal 464, which is subsequently provided to the antenna port 430 for transmission via the antenna 432.

Given that the DPD circuit 404 is able to accurately determine and store the timing offset during the training process, the DPD circuit 404 may be able to create the artificial distortion term in the predistorted digital test signal 470 to have the substantially similar amplitude and the substantially opposing phase relative to the unwanted distortion term generated by the PA 438. Accordingly, it may be possible to suppress the unwanted distortion term by the artificial distortion term to below a predefined threshold when the amplified RF test signal 464 is provided to the antenna port 430. As a result, the remote unit 400 may be able to satisfy the stringent regulatory/industrial requirements, such as IMD3 and ACPR requirements.

Figure 7A:
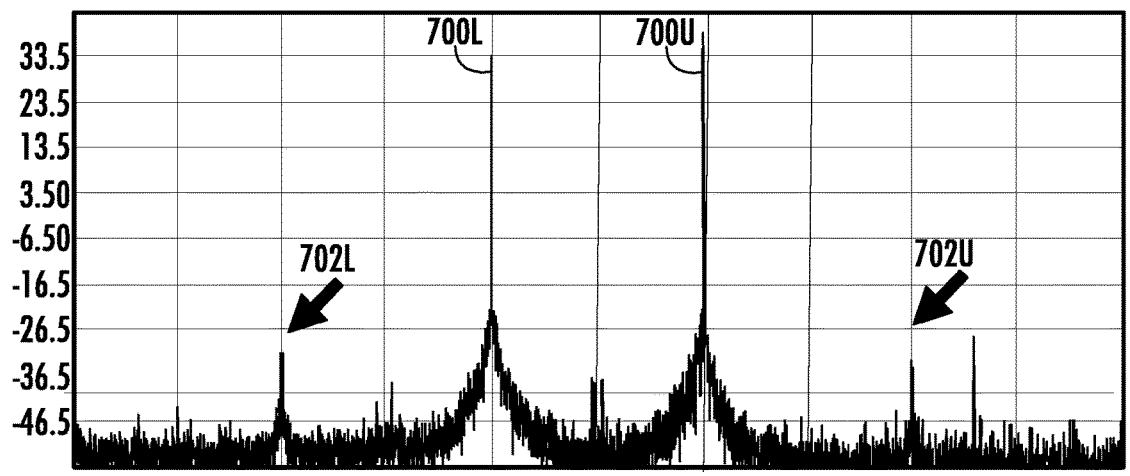
FIGS. 7A and 7B are graphic diagrams providing exemplary illustrations of IMD3 and ACPR improvements that may be achieved by the remote unit of FIG. 4 after employing the DPD front-end circuit.
Figure 7B:
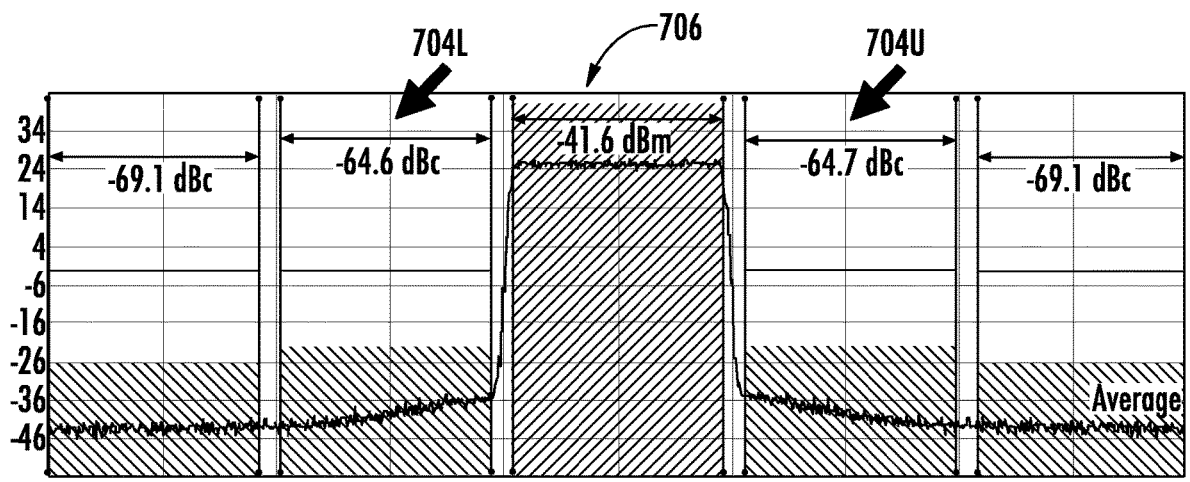

FIGS. 7A and 7B are graphic diagrams providing exemplary illustrations of IMD3 and ACPR improvements that may be achieved by the remote unit 400 of FIG. 4 after employing the DPD front-end circuit 402. Elements in FIG. 4 are referenced in conjunction with FIGS. 7A and 7B and will not be re-described herein.

With reference to FIG. 7A, the digital input signal 424 can correspond to a lower tone 700L and an upper tone 700U. The PA 438 creates IMD3s 702L and 702U outside the lower tone 700L and the upper tone 700U, respectively. As shown in FIG. 7A, the remote unit 400 can effectively suppress the IMD3s 702L and 702U below a predefined IMD3 threshold (e.g., <−30 dBm). With reference to FIG. 7B, the remote unit 400 is able to reduce the ACPR in a pair of adjacent channels 704L and 704U outside of a wanted channel 706 to below a predefined ACPR threshold (e.g., <−64 dBc).

Figure 8:
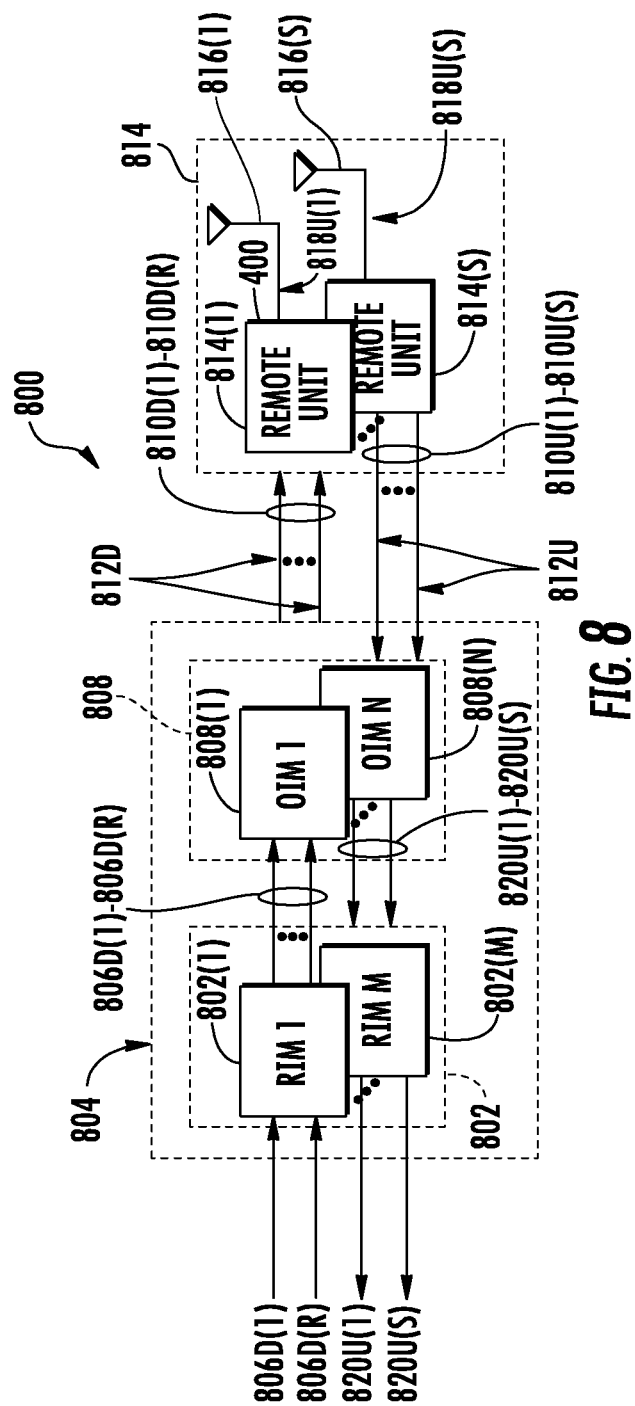
FIG. 8 is a schematic diagram of an exemplary WCS provided in the form of an optical fiber-based DAS that is configured to include the remote unit of FIG. 4.

FIG. 8 is a schematic diagram an exemplary WDS 800 provided in the form of an optical fiber-based WDS that can include a plurality of remote units, such as the remote unit 400 of FIG. 4. The WDS 800 includes an optical fiber for distributing communications services for multiple frequency bands. The WDS 800 in this example is comprised of three (3) main components. A plurality of radio interfaces provided in the form of radio interface modules (RIMs) 802(1)-802(M) are provided in a central unit 804 to receive and process a plurality of downlink communications signals 806D(1)-806D(R) prior to optical conversion into downlink optical fiber-based communications signals. The downlink communications signals 806D(1)-806D(R) may be received from a base station as an example. The RIMs 802(1)-802(M) provide both downlink and uplink interfaces for signal processing. The notations "1-R" and "1-M" indicate that any number of the referenced component, 1-R and 1-M, respectively, may be provided. The central unit 804 is configured to accept the RIMs 802(1)-802(M) as modular components that can easily be installed and removed or replaced in the central unit 804. In one example, the central unit 804 is configured to support up to twelve (12) RIMs 802(1)-802(12). Each of the RIMs 802(1)-802(M) can be designed to support a particular type of radio source or range of radio sources (i.e., frequencies) to provide flexibility in configuring the central unit 804 and the WDS 800 to support the desired radio sources.

For example, one RIM 802 may be configured to support the Personalized Communications System (PCS) radio band. Another RIM 802 may be configured to support the 800 megahertz (MHz) radio band. In this example, by inclusion of the RIMs 802(1)-802(M), the central unit 804 could be configured to support and distribute communications signals on both PCS and Long-Term Evolution (LTE) 700 radio bands, as an example. The RIMs 802(1)-802(M) may be provided in the central unit 804 that support any frequency bands desired, including, but not limited to, the US Cellular band, PCS band, Advanced Wireless Service (AWS) band, 700 MHz band, Global System for Mobile communications (GSM) 900, GSM 1800, and Universal Mobile Telecommunications System (UNITS). The RIMs 802(1)-802(M) may also be provided in the central unit 804 that support any wireless technologies desired, including but not limited to Code Division Multiple Access (CDMA), CDMA200, 1×RTT, Evolution-Data Only (EV-DO), UMTS, High-speed Packet Access (HSPA), GSM, General Packet Radio Services (GPRS), Enhanced Data GSM Environment (EDGE), Time Division Multiple Access (TDMA), LTE, iDEN, and Cellular Digital Packet Data (CDPD).

The RIMs 802(1)-802(M) may be provided in the central unit 804 that support any frequencies desired, including but not limited to US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TTE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

With continuing reference to FIG. 8, the downlink communications signals 806D(1)-806D(R) are provided to a plurality of optical interfaces provided in the form of optical interface modules (OIMs) 808(1)-808(N) in this embodiment to convert the downlink communications signals 806D(1)-806D(R) into a plurality of downlink optical fiber-based communications signals 810D(1)-810D(R). The notation "1-N" indicates that any number of the referenced component 1-N may be provided. The OIMs 808(1)-808(N) may be configured to provide a plurality of optical interface components (OICs) that contain optical-to-electrical (O/E) and electrical-to-optical (E/O) converters, as will be described in more detail below. The OIMs 808(1)-808(N) support the radio bands that can be provided by the RIMs 802(1)-802(M), including the examples previously described above.

The OIMs 808(1)-808(N) each include E/O converters to convert the downlink communications signals 806D(1)-806D(R) into the downlink optical fiber-based communications signals 810D(1)-810D(R). The downlink optical fiber-based communications signals 810D(1)-810D(R) are communicated over a downlink optical fiber-based communications medium 812D to a plurality of remote units 814(1)-814(S). At least one selected remote unit among the remote units 814(1)-814(S) can be configured to function as the remote unit 400 of FIG. 4. The notation "1-S" indicates that any number of the referenced component 1-S may be provided. Remote unit O/E converters provided in the remote units 814(1)-814(S) convert the downlink optical fiber-based communications signals 810D(1)-810D(R) back into the downlink communications signals 806D(1)-806D(R), which are the converted into a plurality of downlink RF communications signals and provided to antennas 816(1)-816(S) in the remote units 814(1)-814(S) to client devices in the reception range of the antennas 816(1)-816(S).

The remote units 814(1)-814(S) receive a plurality of uplink RF communications signals from the client devices through the antennas 816(1)-816(S). The remote units 814(1)-814(S) convert the uplink RF communications signals into a plurality of uplink communications signals 818U(1)-818U(S). Remote unit E/O converters are also provided in the remote units 814(1)-814(S) to convert the uplink communications signals 818U(1)-818U(S) into a plurality of uplink optical fiber-based communications signals 81U(1)-810U(S). The remote units 814(1)-814(S) communicate the uplink optical fiber-based communications signals 810U(1)-810U(S) over an uplink optical fiber-based communications medium 812U to the OIMs 808(1)-808(N) in the central unit 804. The OIMs 808(1)-808(N) include O/E converters that convert the received uplink optical fiber-based communications signals 810U(1)-810U(S) into a plurality of uplink communications signals 820U(1)-820U(S), which are processed by the RIMs 802(1)-802(M) and provided as the uplink communications signals 820U(1)-820U(S). The central unit 804 may provide the uplink communications signals 820U(1)-820U(S) to a base station or other communications system.

Note that the downlink optical fiber-based communications medium 812D and the uplink optical fiber-based communications medium 812U connected to each of the remote units 814(1)-814(S) may be a common optical fiber-based communications medium, wherein for example, wave division multiplexing (WDM) is employed to provide the downlink optical fiber-based communications signals 810D(1)-810D(R) and the uplink optical fiber-based communications signals 810U(1)-810U(S) on the same optical fiber-based communications medium.

Figure 9:
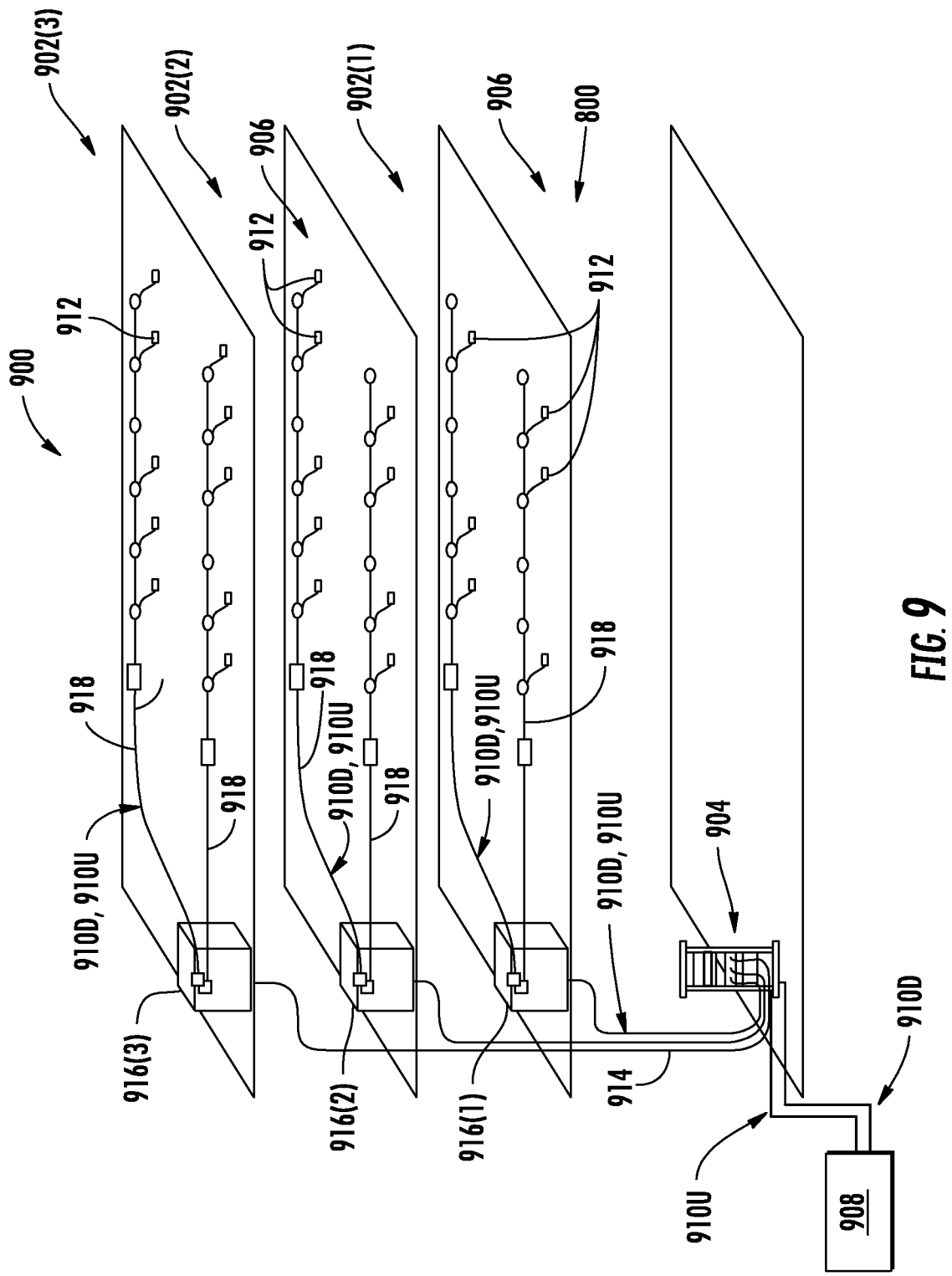
FIG. 9 is a schematic diagram of an exemplary building infrastructure with a deployed DCS, such as the optical fiber-based DAS in FIG. 8.

The WCS 800 in FIG. 8 can be provided in an indoor environment as illustrated in FIG. 9. FIG. 9 is a partial schematic cut-away diagram of an exemplary building infrastructure 900 in which a WDS, such as the WDS 800 of FIG. 8. The building infrastructure 900 in this embodiment includes a first (ground) floor 902(1), a second floor 902(2), and a third floor 902(3). The floors 902(1)-902(3) are serviced by a central unit 904 to provide antenna coverage areas 906 in the building infrastructure 900. The central unit 904 is communicatively coupled to a base station 908 to receive downlink communications signals 910D from the base station 908. The central unit 904 is communicatively coupled to a plurality of remote units 912 to distribute the downlink communications signals 910D to the remote units 912 and to receive uplink communications signals 910U from the remote units 912, as previously discussed above. The downlink communications signals 910D and the uplink communications signals 910U communicated between the central unit 904 and the remote units 912 are carried over a riser cable 914. The riser cable 914 may be routed through interconnect units (ICUs) 916(1)-916(3) dedicated to each of the floors 902(1)-902(3) that route the downlink communications signals 910D and the uplink communications signals 910U to the remote units 912 and also provide power to the remote units 912 via array cables 918.

Figure 10:
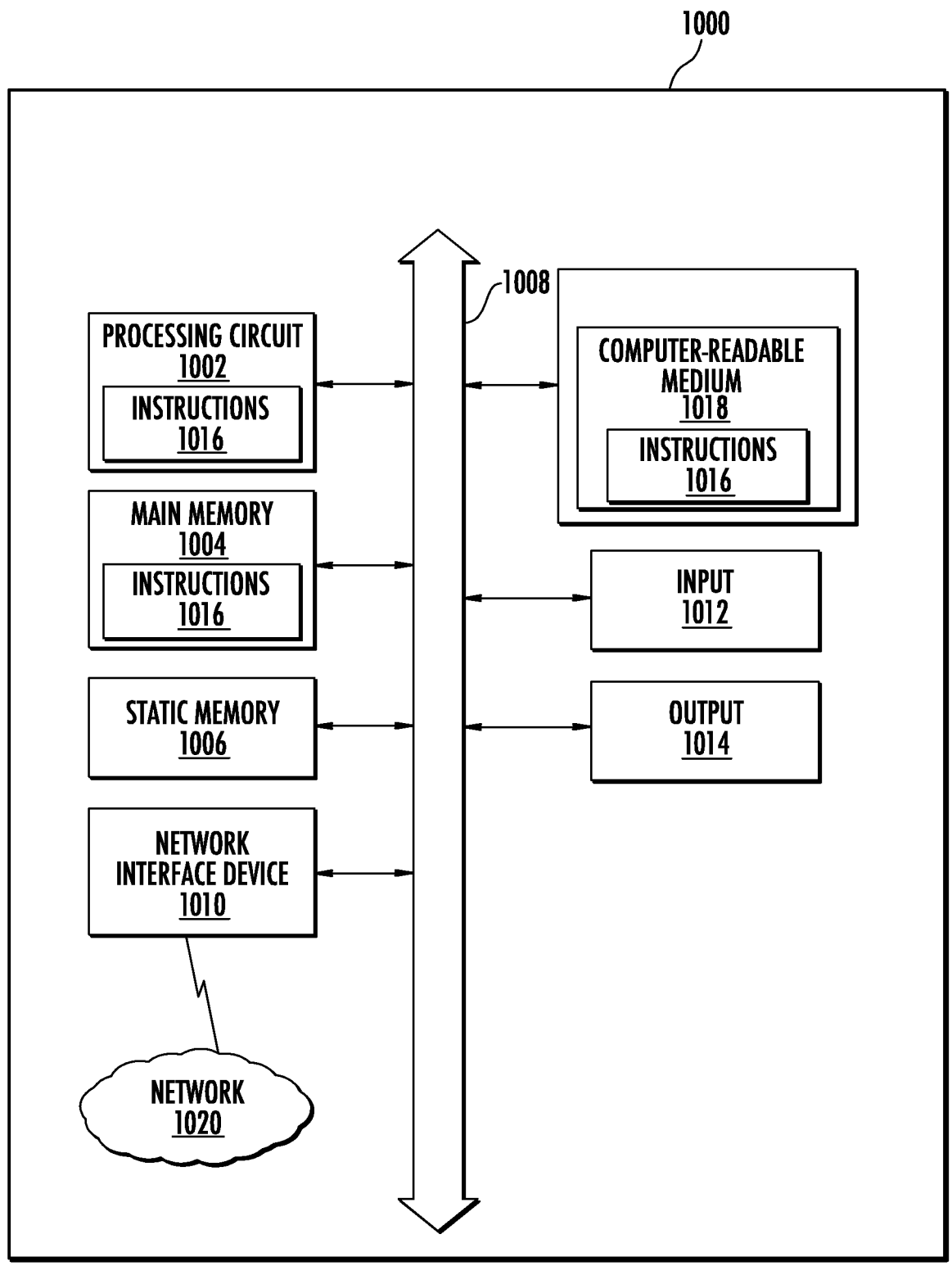
FIG. 10 is a schematic diagram of a representation of an exemplary computer system that can be included in or interface with any of the components in the remote unit of FIG. 4, wherein the exemplary computer system is configured to execute instructions from an exemplary computer-readable medium.

Any of the circuits in the remote unit 400 of FIG. 4 (e.g., the DPD front-end circuit 402 and the DPD circuit 404) can include a computer system 1000, such as shown in FIG. 10, to cam out their functions and operations. With reference to FIG. 10, the computer system 1000 includes a set of instructions for causing the multi-operator radio node component(s) to provide its designed functionality, and their circuits discussed above. The multi-operator radio node component(s) may be connected (e.g., networked) to other machines in a LAN, an intranet, an extranet, or the Internet. The multi-operator radio node component(s) may operate in a client-server network environment, or as a peer machine in a peer-to-peer (or distributed) network environment. While only a single device is illustrated, the term "device" shall also be taken to include any collection of devices that individually or jointly execute a set (or multiple sets) of instructions to perform any one or more of the methodologies discussed herein. The multi-operator radio node component(s) may be a circuit or circuits included in an electronic board card, such as a printed circuit board (PCB) as an example, a server, a personal computer, a desktop computer, a laptop computer, a personal digital assistant (PDA), a computing pad, a mobile device, or any other device, and may represent, for example, a server, edge computer, or a user's computer. The exemplary computer system 1000 in this embodiment includes a processing circuit or processor 1002, a main memory 1004 (e.g., read-only memory (ROM), flash memory, dynamic random access memory (DRAM) such as synchronous DRAM (SDRAM), etc.), and a static memory 1006 (e.g., flash memory, static random access memory (SRAM), etc.), which may communicate with each other via a data bus 1008. Alternatively, the processing circuit 1002 may be connected to the main memory 1004 and/or static memory 1006 directly or via some other connectivity means. The processing circuit 1002 may be a controller, and the main memory 1004 or static memory 1006 may be any type of memory.

The processing circuit 1002 represents one or more general-purpose processing circuits such as a microprocessor, central processing unit, or the like. More particularly, the processing circuit 1002 may be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing circuit 1002 is configured to execute processing logic in instructions 1016 for performing the operations and steps discussed herein.

The computer system 1000 may further include a network interface device 1010. The computer system 1000 also may or may not include an input 1012 to receive input and selections to be communicated to the computer system 1000 when executing instructions. The computer system 1000 also may or may not include an output 1014, including but not limited to a display, a video display unit (e.g., a liquid crystal display (LCD) or a cathode ray tube (CRT)), an alphanumeric input device (e.g., a keyboard), and/or a cursor control device (e.g., a mouse).

The computer system 1000 may or may not include a data storage device that includes instructions 1016 stored in a computer-readable medium 1018. The instructions 1016 may also reside, completely or at least partially, within the main memory 1004 and/or within the processing circuit 1002 during execution thereof by the computer system 1000, the main memory 1004 and the processing circuit 1002 also constituting computer-readable medium. The instructions 1016 may further be transmitted or received over a network 1020 via the network interface device 1010.

While the computer-readable medium 1018 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the processing circuit and that cause the processing circuit to perform any one or more of the methodologies of the embodiments disclosed herein. The term "computer-readable medium" shall accordingly be taken to include, but not be limited to, solid-state memories, optical and magnetic medium, and carrier wave signals.

Figure 11:
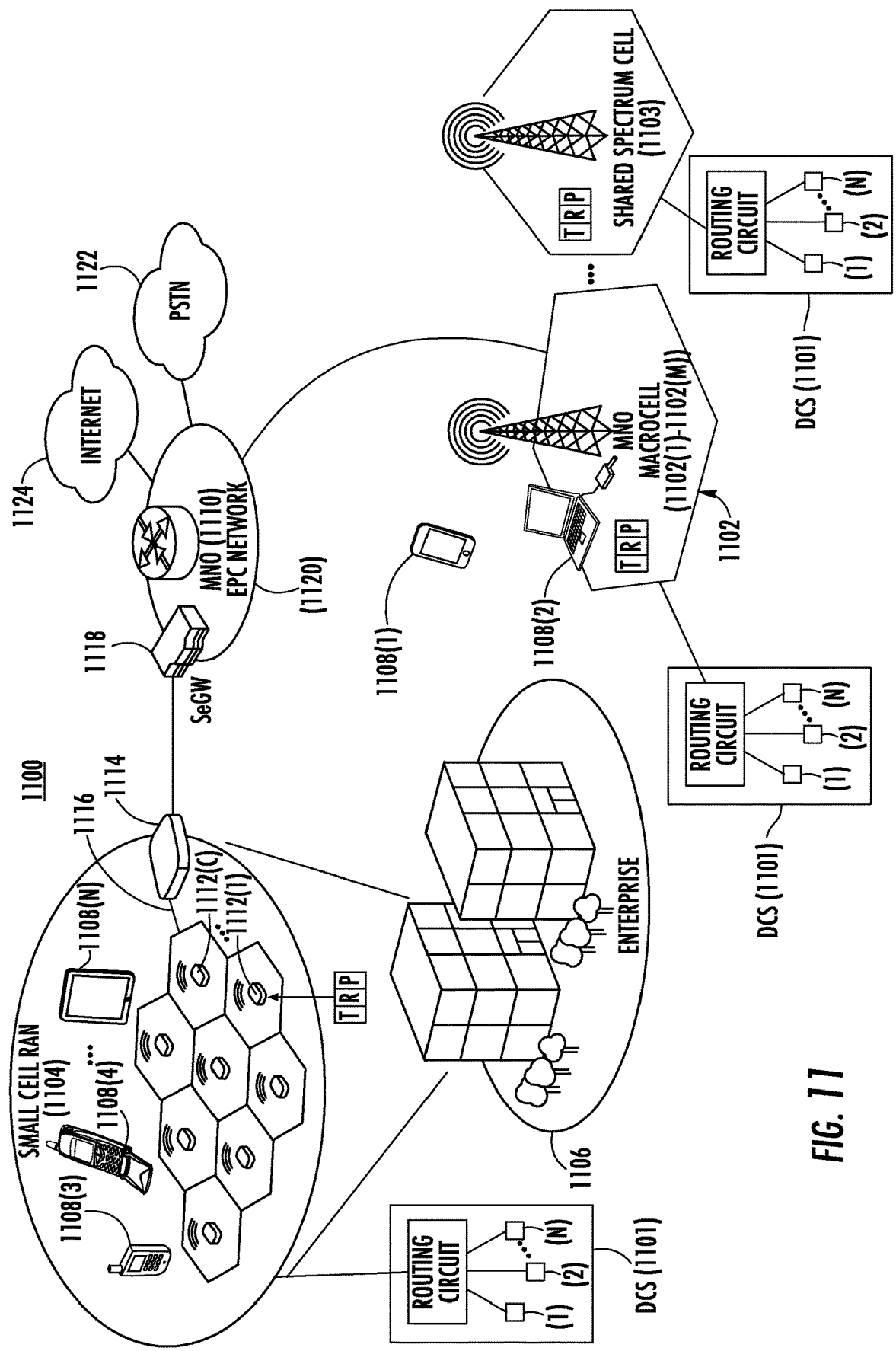
FIG. 11 is a schematic diagram of an exemplary mobile telecommunications environment that includes an exemplary radio access network (RAN) that includes a mobile network operator (MNO) macrocell employing a radio node, a shard spectrum cell employing a radio node, an exemplary small cell RAN employing a multi-operator radio node located within an enterprise environment, wherein any of the radio nodes can employ or be coupled to a shared spectrum DCS configured to selectively route channels of shared spectrum downlink communications signals of multiple service providers to remote units based on shared spectrum input information used to determine spectrum usage coordination between the remote units, including but not limited to the WCS of FIG. 8.

The WCS 800 of FIG. 8, which includes the remote unit 400 of FIG. 4 configured to to enable the DPD circuit 404 to accurately determine a timing offset for effective distortion cancellation in the remote unit 400 can also be interfaced with different types of radio nodes of service providers and/or supporting service providers, including macrocell systems, small cell systems, and remote radio heads (RRH) systems, as examples. For example, FIG. 11 is a schematic diagram of an exemplary mobile telecommunications environment 1100 (also referred to as "environment 1100") that includes radio nodes and cells that may support shared spectrum, such as unlicensed spectrum, and can be interfaced to shared spectrum DCSs 1101 supporting coordination of distribution of shared spectrum from multiple service providers to remote units to be distributed to subscriber devices. The shared spectrum DCSs 1101 can include the WCS 800 of FIG. 8 as an example.

The environment 1100 includes exemplary macrocell RANs 1102(1)-1102(M) ("macrocells 1102(1)-1102(M)") and an exemplary small cell RAN 1104 located within an enterprise environment 1106 and configured to service mobile communications between a user mobile communications device 1108(1)-1108(N) to a mobile network operator (MNO) 1110. A serving RAN for a user mobile communications device 1108(1)-1108(N) is a RAN or cell in the RAN in which the user mobile communications devices 1108(1)-1108(N) have an established communications session with the exchange of mobile communications signals for mobile communications. Thus, a serving RAN may also be referred to herein as a serving cell. For example, the user mobile communications devices 1108(3)-1108(N) in FIG. 11 are being serviced by the small cell RAN 1104, whereas user mobile communications devices 1108(1) and 1108(2) are being serviced by the macrocell 1102. The macrocell 1102 is an MNO macrocell in this example. However, a shared spectrum RAN 1103 (also referred to as "shared spectrum cell 1103") includes a macrocell in this example and supports communications on frequencies that are not solely licensed to a particular MNO, such as CBRS for example, and thus may service user mobile communications devices 1108(1)-1108(N) independent of a particular MNO. For example, the shared spectrum cell 1103 may be operated by a third party that is not an MNO and wherein the shared spectrum cell 1103 supports CBRS. Also, as shown in FIG. 11, the MNO macrocell 1102, the shared spectrum cell 1103, and/or the small cell RAN 1104 can interface with a shared spectrum DCS 1101 supporting coordination of distribution of shared spectrum from multiple service providers to remote units to be distributed to subscriber devices. The MNO macrocell 1102, the shared spectrum cell 1103, and the small cell RAN 1104 may be neighboring radio access systems to each other, meaning that some or all can be in proximity to each other such that a user mobile communications device 1108(3)-1108(N) may be able to be in communications range of two or more of the MNO macrocell 1102, the shared spectrum cell 1103, and the small cell RAN 1104 depending on the location of user mobile communications devices 1108(3)-1108(N).

In FIG. 11, the mobile telecommunications environment 1100 in this example is arranged as an LTE (Long Term Evolution) system as described by the Third Generation Partnership Project (3GPP) as an evolution of the GSM/UMTS standards (Global System for Mobile communication/Universal Mobile Telecommunications System). It is emphasized, however, that the aspects described herein may also be applicable to other network types and protocols. The mobile telecommunications environment 1100 includes the enterprise 1106 in which the small cell RAN 1104 is implemented. The small cell RAN 1104 includes a plurality of small cell radio nodes 1112(1)-1112(C). Each small cell radio node 1112(1)-1112(C) has a radio coverage area (graphically depicted in the drawings as a hexagonal shape) that is commonly termed a "small cell." A small cell may also be referred to as a femtocell or, using terminology defined by 3GPP, as a Home Evolved Node B (HeNB). In the description that follows, the term "cell" typically means the combination of a radio node and its radio coverage area unless otherwise indicated.

In FIG. 11, the small cell RAN 1104 includes one or more services nodes (represented as a single services node 1114) that manage and control the small cell radio nodes 1112(1)-1112(C). In alternative implementations, the management and control functionality may be incorporated into a radio node, distributed among nodes, or implemented remotely (i.e., using infrastructure external to the small cell RAN 1104). The small cell radio nodes 1112(1)-1112(C) are coupled to the services node 1114 over a director local area network (LAN) connection 1116 as an example, typically using secure IPsec tunnels. The small cell radio nodes 1112(1)-1112(C) can include multi-operator radio nodes. The services node 1114 aggregates voice and data traffic from the small cell radio nodes 1112(1)-1112(C) and provides connectivity over an IPsec tunnel to a security gateway (SeGW) 1118 in a network 1120 (e.g., evolved packet core (EPC) network in a 4G network, or 5G Core in a 5G network) of the MNO 1110. The network 1120 is typically configured to communicate with a public switched telephone network (PSTN) 1122 to carry circuit-switched traffic, as well as for communicating with an external packet-switched network such as the Internet 1124.

The environment 1100 also generally includes a node (e.g., eNodeB or gNodeB) base station, or "macrocell" 1102. The radio coverage area of the macrocell 1102 is typically much larger than that of a small cell where the extent of coverage often depends on the base station configuration and surrounding geography. Thus, a given user mobile communications device 1108(3)-1108(N) may achieve connectivity to the network 1120 (e.g., EPC network in a 4G network, or 5G Core in a 5G network) through either a macrocell 1102 or small cell radio node 1112(1)-1112(C) in the small cell RAN 1104 in the environment 1100.

Note that as an example, any "ports," "combiners," "splitters," and other "circuits" mentioned in this description may be implemented using Field Programmable Logic Array(s) (FPGA(s)) and/or a digital signal processor(s) (DSP(s)), and therefore, may be embedded within the FPGA or be performed by computational processes.

The embodiments disclosed herein include various steps. The steps of the embodiments disclosed herein may be performed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., read only memory ("ROM"), random access memory ("RAM"), magnetic disk storage medium, optical storage medium, flash memory devices, etc.).

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A controller may be a processor. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

We claim:

1. A digital predistortion (DPD) font-end circuit in a remote unit for a wireless communications system (WCS), comprising:
   an input port configured to receive a digital input signal;
   an output port coupled to a DPD circuit;
   a training signal generation circuit configured to generate a digital training signal corresponding to a predefined waveform pattern;
   a multiplexer circuit configured to selectively provide one of the digital input signal and the digital training signal to the output port; and
   a control circuit configured to cause the multiplexer circuit to provide the digital training signal to the output port in response to receiving a DPD training indication signal such that the DPD circuit can perform a DPD timing alignment based on the digital training signal.

2. The DPD front-end circuit of claim 1, wherein the control circuit is further configured to cause the multiplexer circuit to block the digital input signal from the output port in response to receiving the DPD training indication signal.

3. The DPD front-end circuit of claim 1, wherein the control circuit is further configured to cause the multiplexer circuit to provide the digital input signal to the output port and disable the training signal generation circuit in response to receiving a DPD training completion indication signal.

4. The DPD front-end circuit of claim 3, wherein the digital input signal is a two-tone digital test signal.

5. The DPD front-end circuit of claim 1, wherein the training signal generation circuit comprises a waveform generator configured to generate the digital training signal corresponding to the predefined waveform pattern.

6. The DPD front-end circuit of claim 5, wherein the waveform generator is further configured to generate the digital training signal based on a waveform file.

7. The DPD front-end circuit of claim 6, wherein the waveform file is prestored in a memory device.

8. The DPD front-end circuit of claim 5, further comprising a gain controller configured to adjust an amplitude of the digital training signal.

9. A remote unit for a wireless communications system (WCS), comprising:
   a digital predistortion (DPD) circuit; and
   a DPD front-end circuit, comprising:
      an input port configured to receive a digital input signal;
      an output port coupled to the DPD circuit;
      a training signal generation circuit configured to generate a digital training signal corresponding to a predefined waveform pattern;
      a multiplexer circuit configured to selectively provide one of the digital input signal and the digital training signal to the output port; and
      a control circuit configured to cause the multiplexer circuit to provide the digital training signal to the output port in response to receiving a DPD training indication signal such that the DPD circuit can perform a DPD timing alignment based on the digital training signal.

10. The remote unit of claim 9, further comprising:
    an antenna port coupled to an antenna;
    a signal path, comprising:
       a digital-to-analog converter (DAC) coupled to the DPD circuit;
       a downlink signal frequency conversion circuit coupled to the DAC;
       a power amplifier coupled to the downlink signal frequency conversion circuit; and
       a coupler coupled between the power amplifier and the antenna port; and
    a feedback path, comprising:
       a feedback signal frequency conversion circuit coupled to the coupler; and
       an analog-to-digital converter (ADC) coupled between the feedback signal frequency conversion circuit and the DPD circuit.

11. The remote unit of claim 10, further comprising a switching circuit coupled between the coupler and the antenna port.

12. The remote unit of claim 11, wherein the control circuit is further configured to cause the multiplexer circuit to block the digital input signal from the output port in response to receiving the DPD training indication signal.

13. The remote unit of claim 12, wherein the control circuit is further configured to control the switching circuit to decouple the coupler from the antenna port in response to receiving the DPD training indication signal.

14. The remote unit of claim 12, wherein:
    the DPD circuit is configured to receive the digital training signal from the output port and provide the digital training signal to the DAC;
    the DAC is configured to convert the digital training signal into an intermediate frequency (IF) training signal;
    the downlink signal frequency conversion circuit is configured to convert the IF training signal into a radio frequency (RF) training signal;
    the power amplifier is configured to amplify the RF training signal to generate an amplified RF training signal;
    the coupler is configured to provide the amplified RF training signal to the feedback signal frequency conversion circuit;
    the feedback signal frequency conversion circuit is configured to convert the amplified RF training signal into an IF feedback signal;
    the ADC is configured to convert the IF feedback signal into a digital feedback signal; and the DPD circuit is further configured to determine and store a timing offset between the digital training signal and the digital feedback signal based on the predefined waveform pattern.

15. The remote unit of claim 14, wherein the control circuit is further configured to cause the multiplexer circuit to provide the digital input signal to the output port and disable the training signal generation circuit in response to receiving a DPD training completion indication signal.

16. The remote unit of claim 15, wherein the digital input signal is a two-tone digital test signal.

17. The remote unit of claim 15, wherein the control circuit is further configured to control the switching circuit to couple the coupler to the antenna port in response to receiving the DPD training completion indication signal.

18. The remote unit of claim 15, wherein:
the DPD circuit is configured to receive the digital input signal from the output port and provide the digital input signal to the DAC;
the DAC is configured to convert the digital input signal into an IF test signal;
the downlink signal frequency conversion circuit is configured to convert the IF test signal into an RF test signal;
the power amplifier is configured to amplify the RF test signal to generate an amplified RF test signal comprising the RF test signal and at least one unwanted distortion term;
the coupler is configured to provide the amplified RF test signal to the feedback signal frequency conversion circuit;
the feedback signal frequency conversion circuit is configured to convert the amplified RF test signal into an IF test feedback signal;
the ADC is configured to convert the IF feedback signal into a digital test feedback signal;
the DPD circuit is further configured to generate a predistorted digital test signal comprising an artificial distortion term based on the digital input signal, the digital test feedback signal, and the stored timing offset;
the DAC is further configured to convert the predistorted digital test signal into a predistorted IF test signal;
the downlink signal frequency conversion circuit is further configured to convert the predistorted IF test signal into a predistorted RF test signal; and
the power amplifier is further configured to amplify the predistorted RF test signal to generate the amplified RF test signal, wherein the at least one unwanted distortion term is suppressed by the artificial distortion term to below a predefined threshold.

19. The remote unit of claim 9, wherein the training signal generation circuit comprises a waveform generator configured to generate the digital training signal corresponding to the predefined waveform pattern.

20. The remote unit of claim 19, wherein the waveform generator is further configured to generate the digital training signal based on a waveform file.

21. The remote unit of claim 20, wherein the waveform file is prestored in a memory device.

22. The remote unit of claim 19, further comprising a gain controller configured to adjust an amplitude of the digital training signal.

23. A wireless communications system (WCS), comprising:
a central unit; and
a plurality of remote units coupled to the central unit via a plurality of communications mediums;
wherein:
the central unit is configured to communicate a plurality of downlink communications signals and a plurality of uplink communications signals with the plurality of remote units over the plurality of communications mediums; and
at least one of the plurality of remote units, comprising:
a digital predistortion (DPD) circuit; and
a DPD front-end circuit, comprising:
an input port configured to receive a digital input signal;
an output port coupled to the DPD circuit;
a training signal generation circuit configured to generate a digital training signal corresponding to a predefined waveform pattern;
a multiplexer circuit configured to selectively provide one of the digital input signal and the digital training signal to the output port; and
a control circuit configured to cause the multiplexer circuit to provide the digital training signal to the output port in response to receiving a DPD training indication signal such that the DPD circuit can perform a DPD timing alignment based on the digital training signal.

24. The WCS of claim 23, wherein:
the plurality of communications mediums corresponding to a plurality of optical fiber-based communications mediums, respectively;
the central unit, comprising:
a plurality of electrical-to-optical (E/O) converters configured to convert the plurality of downlink communications signals into a plurality of downlink optical communications signals for distribution to the plurality of remote units; and
a plurality of optical-to-electrical (O/E) converters configured to convert a plurality of uplink optical communications signals into the plurality of uplink communications signals; and
the plurality of remote units, comprising:
a plurality of remote unit O/E converters configured to convert the plurality of downlink optical communications signals into the plurality of downlink communications signals; and
a plurality of remote unit E/O converters configured to convert the plurality of uplink communications signals into the plurality of uplink optical communications signals.

* * * * *

UNITED STATES PATENT AND TRADEMARK OFFICE
CERTIFICATE OF CORRECTION

PATENT NO. : 10,887,079 B1  
APPLICATION NO. : 16/584867  
DATED : January 5, 2021  
INVENTOR(S) : Nir Geron et al.

Page 1 of 1

It is certified that error appears in the above-identified patent and that said Letters Patent is hereby corrected as shown below:

In the Claims

In Column 19, Line 25, Claim 1, delete "font-end" and insert -- front-end --, therefor.

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*